US011081821B2

United States Patent
Blackburn et al.

(10) Patent No.: US 11,081,821 B2
(45) Date of Patent: Aug. 3, 2021

(54) DIRECT MATE CABLE ASSEMBLY

(71) Applicant: TE CONNECTIVITY CORPORATION, Berwyn, PA (US)

(72) Inventors: Christopher William Blackburn, Bothell, WA (US); Jeffery Walter Mason, North Attleboro, MA (US); Bruce Allen Champion, Camp Hill, PA (US); Nathan Lincoln Tracy, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/849,682

(22) Filed: Apr. 15, 2020

(65) Prior Publication Data

US 2020/0366017 A1    Nov. 19, 2020

Related U.S. Application Data

(60) Provisional application No. 62/848,779, filed on May 16, 2019.

(51) Int. Cl.
| | |
|---|---|
| *H01R 12/00* | (2006.01) |
| *H01R 12/71* | (2011.01) |
| *H01R 13/6582* | (2011.01) |
| *H01R 13/6587* | (2011.01) |
| *H01R 13/514* | (2006.01) |
| *H05K 1/11* | (2006.01) |
| *H01R 13/6594* | (2011.01) |

(52) U.S. Cl.
CPC ......... *H01R 12/716* (2013.01); *H01R 13/514* (2013.01); *H01R 13/6582* (2013.01); *H01R 13/6587* (2013.01); *H01R 13/6594* (2013.01); *H05K 1/111* (2013.01); *H05K 2201/10356* (2013.01)

(58) Field of Classification Search
CPC ................ H01R 12/716; H01R 13/514; H01R 13/6582; H01R 13/6587; H01R 13/6594; H05K 1/111; H05K 2201/10356
USPC ...................................................... 439/77–84
See application file for complete search history.

(56) References Cited

U.S. PATENT DOCUMENTS

| | | | |
|---|---|---|---|
| 6,743,050 B1 * | 6/2004 | Wu ..................... | H01R 13/6275 439/607.06 |
| 7,148,428 B2 | 12/2006 | Meier et al. | |
| 10,446,959 B2 * | 10/2019 | Groom ............... | H01R 12/7064 |

FOREIGN PATENT DOCUMENTS

| | | |
|---|---|---|
| WO | 2016112384 A1 | 7/2016 |
| WO | 2017023756 A1 | 2/2017 |

* cited by examiner

*Primary Examiner* — Khiem M Nguyen

(57) ABSTRACT

A communication system includes a circuit board having circuit board signal and ground contacts on the upper surface. The communication system includes a cable assembly having a housing holding a cable module with cables. A ground shield and signal contacts are electrically connected to the cables. The ground shield includes ground beams with ground mating interfaces coupled to corresponding circuit board ground contacts. Each signal contact has a terminating pad terminated to the cable conductor and a signal beam with a signal mating interface coupled to the circuit board signal contact. The housing includes contact channels receiving the signal and ground beams with the mating interfaces exposed for interfacing with the circuit board.

20 Claims, 16 Drawing Sheets

DIRECT MATE CABLE ASSEMBLY

CROSS REFERENCE TO RELATED APPLICATIONS

This application claims benefit to U.S. Provisional Application No. 62/848,779, filed 16 May 2019, titled "DIRECT MATE CABLE ASSEMBLY", the subject matter of which is herein incorporated by reference in its entirety.

BACKGROUND OF THE INVENTION

The subject matter herein relates generally to cable assemblies.

The ongoing trend toward smaller, lighter, and higher performance electrical components and higher density electrical circuits has led to the development of surface mount technology in the design of printed circuit boards and integrated circuit assemblies. Conventional systems are struggling with meeting signal and power output from integrated circuit assemblies because there is a need for smaller size and higher number of conductors while maintaining good electrical performance. Conventional integrated circuit assemblies have a limited amount of surface area along the bottom of the circuit board for conductors to electrically connect to a host circuit board.

A need remains for a communication system having improved electrical performance and signal density.

BRIEF DESCRIPTION OF THE INVENTION

In one embodiment, a communication system is provided. The communication system includes a circuit board that has substrate. The substrate has an upper surface and a lower surface. The circuit board includes circuit board ground contacts and circuit board signal contacts on the upper surface. The communication system includes a cable assembly that has a cable module and a housing holding the cable module. The cable module includes cables. A ground shield is electrically connected to the cables. Signal contacts are electrically connected to the cables. Tach cable includes a cable conductor. An insulator holds the cable conductor and a cable shield surrounding the insulator. The ground shield is electrically connected to the cable shield of each cable. The ground shield includes ground beams that extend to ground mating interfaces. The ground mating interfaces are configured to be coupled to corresponding circuit board ground contacts on the circuit board. Each signal contact has a terminating pad that is terminated to the corresponding cable conductor. Each signal contact has a signal beam that extends to a signal mating interface. The signal mating interfaces of the signal contacts are configured to be coupled to corresponding circuit board signal contacts on the circuit board. The housing has a mounting end mounted to the circuit board. The housing includes contact channels that receive the ground beam. The signal beams with the ground mating interfaces are exposed at the mounting end of the housing for interfacing with the circuit board and with the signal mating interfaces exposed at the mounting end of the housing for interfacing with the circuit board.

In another embodiment, a cable assembly is provided. The cable assembly includes a cable module that includes cables. A ground shield is electrically connected to the cables. Signal contacts are electrically connected to the cables. Each cable includes a cable conductor. An insulator holds the cable conductor. A cable shield surrounds the insulator. The ground shield is electrically connected to the cable shield of each cable. The ground shield includes ground beams that extend to ground mating interfaces. The ground mating interfaces are configured to be coupled to circuit board ground contacts on a circuit board. Each signal contact has a terminating pad that is terminated to the corresponding cable conductor. Each signal contact has a signal beam that extends to a signal mating interface. The signal mating interfaces of the signal contacts are configured to be coupled to circuit board signal contacts on the circuit board. The cable assembly includes a housing that holds the cable module. The housing has a mounting end that is configured to be mounted to the circuit board. The housing includes contact channels that receive the ground beams. The signal beams with the ground mating interfaces are exposed at the mounting end of the housing for interfacing with the circuit board and with the signal mating interfaces exposed at the mounting end of the housing for interfacing with the circuit board.

In a further embodiment, a cable assembly is provided. The cable assembly includes a first cable module that has first cables, a first ground shield electrically connected to the first cables, and first signal contacts electrically connected to the first cables. Each first cable includes a first cable conductor, a first insulator that holds the first cable conductor and a first cable shield that surrounds the first insulator. The first ground shield is electrically connected to the first cable shield of each first cable. The first ground shield includes first ground beams that extend to first ground mating interfaces. The first ground mating interfaces are configured to be coupled to first circuit board ground contacts on a circuit board. Each first signal contact has a first terminating pad that is terminated to the corresponding first cable conductor. Each first signal contact has a first signal beam that extends to a first signal mating interface. The first signal mating interfaces of the first signal contacts are configured to be coupled to first circuit board signal contacts on the circuit board. The first signal beams and the first ground beams are arranged in a first row. The cable assembly includes a second cable module that has second cables, a second ground shield electrically connected to the second cables, and second signal contacts electrically connected to the second cables. Each second cable includes a second cable conductor, a second insulator that holds the second cable conductor and a second cable shield that surrounds the second insulator. The second ground shield is electrically connected to the second cable shield of each second cable. The second ground shield includes second ground beams that extend to second ground mating interfaces. The second ground mating interfaces are configured to be coupled to second circuit board ground contacts on a circuit board. Each second signal contact has a second terminating pad that is terminated to the corresponding second cable conductor. Each second signal contact has a second signal beam that extends to a second signal mating interface. The second signal mating interfaces of the second signal contacts are configured to be coupled to second circuit board signal contacts on the circuit board. The second signal beams and the second ground beams are arranged in a second row. The cable assembly includes a housing that holds the first and second cable modules. The housing has a front and a rear. The housing has a mounting end that is configured to be mounted to the circuit board. The housing includes first contact channels that receive the first ground beams and the first signal beams. The housing includes second contact channels that receive the second ground beams and the second signal beams. The first ground mating interfaces and the first signal mating interfaces are exposed at the mounting end in the first row for interfacing with the circuit board. The second ground mating interfaces and the second signal mating interfaces are exposed at the mounting end in the second row for interfacing with the circuit board. The second row is offset rearward from the first row.

DETAILED DESCRIPTION OF THE INVENTION

Figure 1:
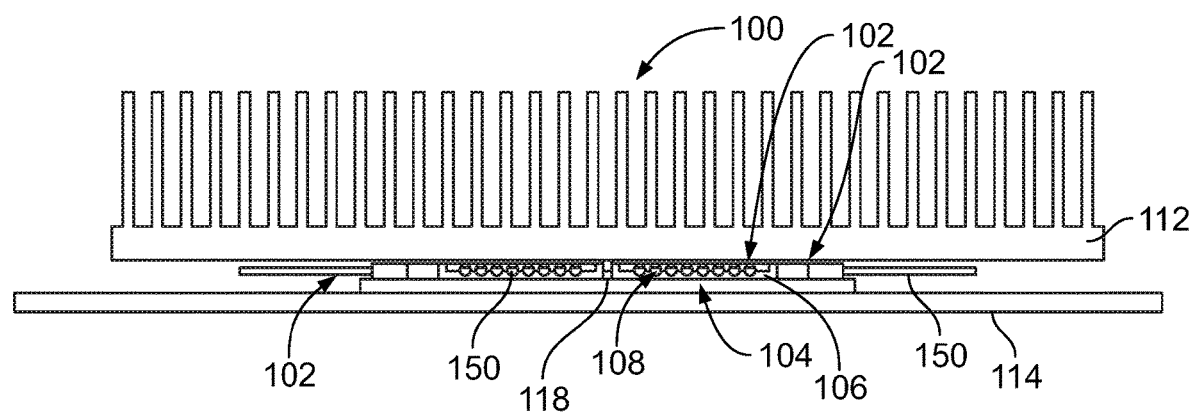
FIG. 1 is a side view of a communication system having a cable assembly formed in accordance with an exemplary embodiment.

FIG. 1 is a side view of a communication system 100 having a cable assembly 102 formed in accordance with an exemplary embodiment. The cable assembly 102 is configured to be electrically connected to a communication component 104, such as a circuit board, which may be referred to hereinafter as a circuit board 104. The cable assembly 102 is directly mated with the communication component 104. In various embodiments, the communication component 104 is an integrated circuit assembly, such as an ASIC. However, the communication component 104 may be another type of communication component, such as a processor, an interposer assembly, a socket assembly, a host circuit board assembly, and the like. In an exemplary embodiment, a plurality of cable assemblies 102 are coupled to the communication component 104. For example, cable assemblies 102 may be provided on multiple sides of a communication element 118 of the communication component 104. For example, in the illustrated embodiment, cable assemblies 102 are provided on all four sides of the communication element 118. Other arrangements are possible in alternative embodiments.

The cable assembly 102 includes a housing 106 and one or more cable modules 108 coupled to the housing 106. The housing 106 holds the one or more cable modules 108 and is used to mechanically and electrically connect the one or more cable modules 108 to the circuit board 104. The housing 106 may be used for locating and/or supporting the cable modules 108 for coupling to the circuit board 104. Each cable module 108 is electrically connected to the circuit board 104 at a separable mating interface in an exemplary embodiment. For example, the cable module 108 may include a land grid array (LGA) interface with the circuit board 104. Contacts of the cable modules 108 are directly connected to the circuit board 104 (e.g., to the top surface of the circuit board 104) at separable mating interfaces. In an exemplary embodiment, the cable modules 108 have a low profile for mating to the circuit board 104 below another component, such as a heat sink 112. In various embodiments, the cable modules 108 may include electrical cables having copper signal conductors for transmitting signals. In other various embodiments, the cable modules 108 may include fiber optic cables having optical fibers for transmitting signals.

In an exemplary embodiment, the communication system 100 includes the heat sink 112 provided to dissipate heat from the communication component 104, such as from a chip, processor, memory module or other electrical component of the communication component 104. The heat sink 112 may be used to compress the cable modules 108 against the circuit board 104 to maintain an electrical connection between the cable modules 108 and the circuit board 104. The housing 106 may be used for coupling the heat sink 112 to the circuit board 104. For example, the housing 106 may support the heat sink 112 on the circuit board 104. The heat sink 112 may be coupled to a host circuit board 114 or a bolster plate (not shown) below the host circuit board 114 to compress the heat sink 112 against the communication element 118 and/or the cable assembly 102. The compression of the heat sink 112 against the communication element 118 is used for thermal engagement between the heat sink 112 and the communication element 118. The compression of the heat sink 112 against the cable assembly 102 maintains mechanical and electrical connection between the cable assembly 102 and the circuit board 104. Optionally, features such as threaded posts and/or threaded fasteners may be used to couple the heat sink 112 to the host circuit board 114 and/or the bolster plate.

In an exemplary embodiment, a bottom of the circuit board 104 is coupled to the host circuit board 114, such as a motherboard. In various embodiments, the circuit board 104 may be coupled to the host circuit board 114 at a lower mating interface, such as an LGA interface, a BGA interface, and the like. In an exemplary embodiment, the housing 106 and the cable modules 108 are coupled to a top of the circuit board 104 opposite the host circuit board 114. Cables 150 of the cable modules 108 exit the housing 106 from a side of the housing 106. In the illustrated embodiment, the cables 150 extend generally horizontally, such as parallel to the host circuit board 114, limiting the height of the communication system 100. For example, the cables 150 remain located below the heat sink 112. However, in alternative embodiments, the cables 150 may extend vertically through the heat sink 112, such as extending perpendicular to the host circuit board 114. In such embodiment, the cables 150 extend through the heat sink 112 allowing tighter spacing of other components on the host circuit board 114 adjacent the communication system 100.

The communication system 100 allows greater density and connections to the communication component 104 by connecting to both the top and the bottom of the communication component 104. For example, a subset of the signals is routed through the bottom of the communication component 104 into the host circuit board 114 and a subset of the signals are routed through the top of the communication component 104 to the cable modules 108. The performance and design efficiency are enhanced by increasing the number of connection positions to the communication component 104. In an exemplary embodiment, the cable modules 108 are coupled to the communication component 104 at multiple locations (e.g., at four sides of the chip) to increase density of the communication system 100 and shorten electrical paths of the communication system 100. The arrangement reduces the number of electrical interfaces needed along the bottom of the communication component 104 by additionally coupling to the top of the communication component 104. Additionally, some signals, such as high speed data signals, may be transferred directly from the communication component 104 by the cable module 108 rather than being first routed through the host circuit board 114 and/or may be routed along longer signal paths through the cables rather than being routed through traces of the host circuit board 114.

Figure 2:
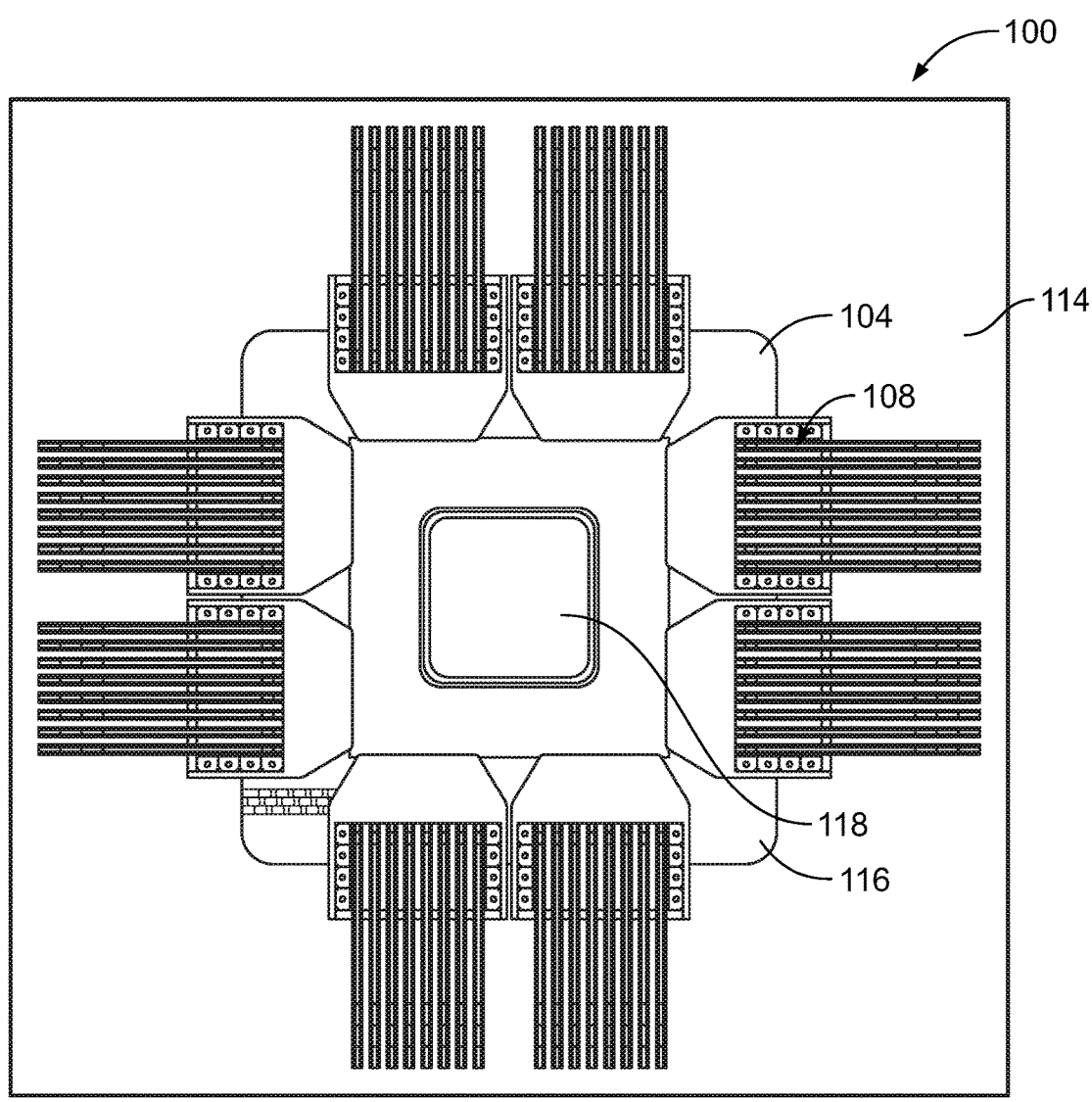
FIG. 2 is a top view of the communication system in accordance with an exemplary embodiment.

FIG. 2 is a top view of the communication system 100 in accordance with an exemplary embodiment. The circuit board 104 includes a substrate 116 and a communication element 118 provided on the substrate 116. The communication element 118 may be a chip, processor, memory module or other component mounted to the top of the circuit board 104. In the illustrated embodiment, is rectangular and approximately centered on the substrate 116; however, the communication element 118 may have other shapes or locations in alternative embodiments.

The substrate 116 has conductors (for example, traces, vias, pads, and the like) that provide electrical paths between the communication element 118 and the cable modules 108 and that provide electrical paths between the communication element 118 and the host circuit board 114. The substrate 116 may be a printed circuit board. The cable modules 108 are configured to be coupled to corresponding conductors of the substrate 116, such as being terminated directly to the conductors at separable mating interfaces. For example, in various embodiments, the cable modules 108 may be terminated to the conductors by a compression mounting using spring beams. In other various embodiments, the cable modules 108 may be terminated to the conductors at a non-separable interface, such as by soldering or by a press-fit connection. The cable modules 108 may be electrically connected to the conductors using contacts, pins, solder balls, conductive elastomeric columns, or other intervening conductive elements. In other various embodiments, the cable modules 108 may be coupled to the communication component 104 at an optic interface, such as using fiber optic elements.

Figure 3:
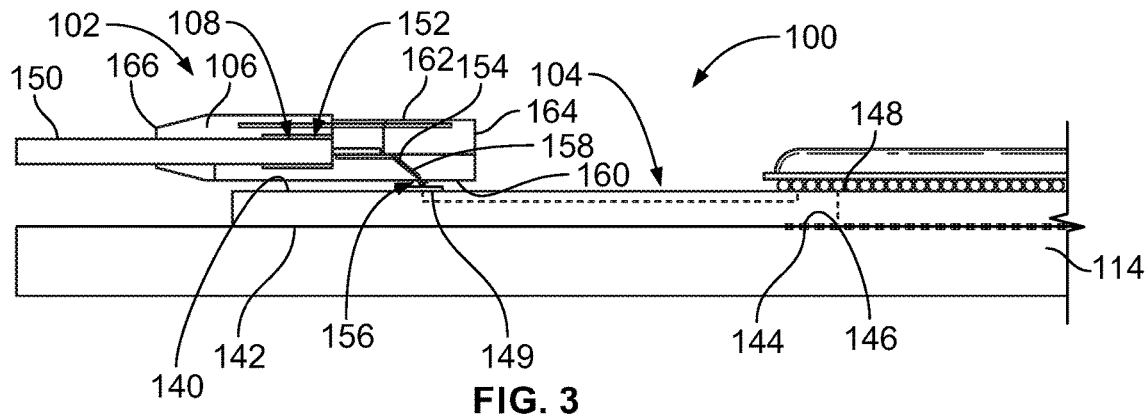
FIG. 3 is a cross-sectional view of a portion of the communication system in accordance with an exemplary embodiment.

FIG. 3 is a cross-sectional view of a portion of the communication system 100 in accordance with an exemplary embodiment. FIG. 3 illustrates the host circuit board 114, the communication component 104 mounted to the host circuit board 114, and the cable assembly 102 coupled to the communication component 104. The heat sink 112 (shown in FIG. 1) is configured to be coupled to the communication component 104 and the cable assembly 102.

In an exemplary embodiment, the substrate 116 includes an upper surface 140 and a lower surface 142. The communication element 118 is mounted to the upper surface 140. The lower surface 142 is configured to be mounted to the host circuit board 114. In an exemplary embodiment, the host circuit board 114 includes host conductors 144 arranged in an array for electrical connection with the substrate 116. For example, the host conductors 144 may be solder pads, solder balls, spring beams, or other types of electrical contacts. The substrate 116 includes corresponding lower conductors 146 on the lower surface 142 that interface with the host conductors 144. For example, the lower conductors 146 may be solder pads, solder balls, spring beams, or other types of electrical contacts.

The communication element 118 is provided on the upper surface 140. The communication element 118 may be a chip or other type of integrated circuit. In various embodiments, the communication element 118 may be an ASIC. In an exemplary embodiment, the substrate 116 includes upper conductors 148 at the upper surface 140. The upper conductors 148 are electrically connected to the communication element 118, such as using a ball grid array (BGA) of solder balls. In an exemplary embodiment, some of the upper conductors 148 are electrically connected to corresponding lower conductors 146, and thus the host circuit board 114 while other upper conductors 148 are electrically connected to corresponding cable modules 108, such as through circuit board contacts 149 on the upper surface 140. The upper conductors 148 are electrically connected to the circuit board contacts 149 through traces of the circuit board 104. The circuit board contacts 149 are configured to be electrically connected to the cable assembly 102 when the cable assembly 102 is mounted to the circuit board 104.

In various embodiments, the upper conductors 148 are electrical conductors, such as pads, vias, traces or other circuit components of the substrate 116. In other various embodiments, the upper conductors 148 may include electrical contacts mounted to the upper surface 140, such as spring contacts having spring beams configured to be compression connected to the cable module 108. In other various embodiments, the upper conductors 148 may include fiber-optic elements for connecting to fiber-optic cables, such as when the cables 150 of the cable module 108 are fiber-optic cables.

The cable module 108 is held by the housing 106 and coupled to the circuit board 104. The cable module 108 includes the cables 150, a ground shield 152 electrically connected to the cables 150, and signal contacts 154 electrically connected to the cables 150. The ground shield 152 includes ground beams 156 configured to be connected to corresponding circuit board contacts 149 of the circuit board 104, such as at a separable mating interface. The signal contacts 154 includes signal beams 158 configured to be connected to corresponding circuit board contacts 149 of the circuit board 104, such as at a separable mating interface. In various embodiments, the ground beams 156 and the signal beams 158 are deflectable spring beams. In other various embodiments, the ground beams 156 and the signal beams 158 are compliant pins configured to be press-fit into the circuit board 104.

In an exemplary embodiment, the housing 106 is manufactured from a rigid material, such as a plastic material or a metal material. The housing holds the cable module(s) 108. The housing 106 extends between a mounting end 160 at a bottom of the housing 106 and a top end 162 opposite the mounting end 160. The mounting end 160 is mounted to the substrate 116. The ground beams 156 and the signal beams 158 extend to the mounting end 160 for mounting to the circuit board contacts 149. The top end 162 is located below the heat sink 112. The housing 106 has a low-profile thickness between the mounting end 160 and the top end 162 to fit in the narrow gap between the heat sink 112 and the upper surface 140 of the substrate 116. The housing 106 includes a front 164 and a cable end 166 at a rear of the housing 106. The cables 150 extend from the cable end 166.

Figure 4:
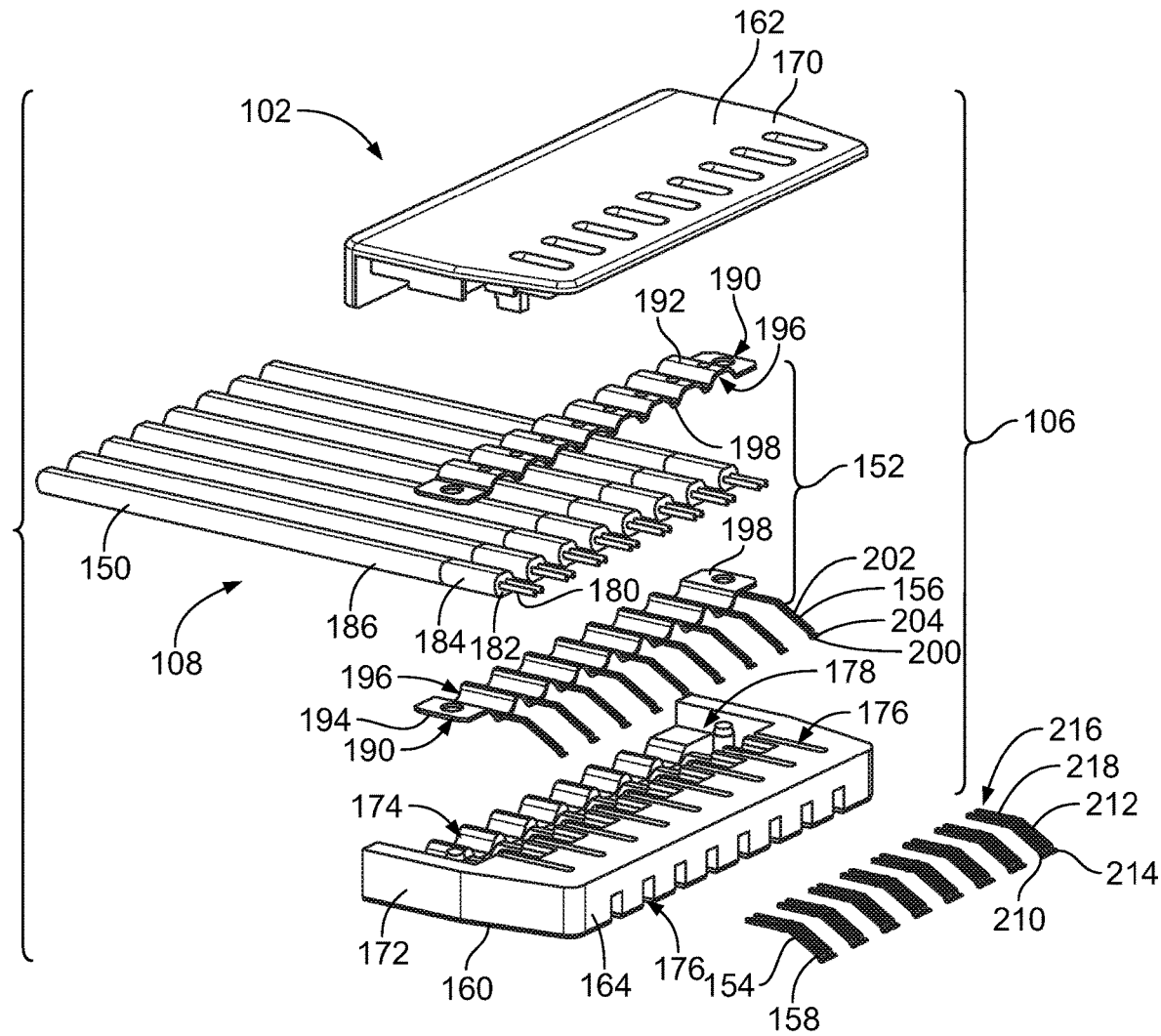
FIG. 4 is an exploded view of the cable assembly in accordance with an exemplary embodiment.

FIG. 4 is an exploded view of the cable assembly 102 in accordance with an exemplary embodiment. FIG. 4 shows the housing 106 and the cable module 108 of the cable assembly 102. The cable module 108 includes a plurality of the cables 150 and corresponding signal contacts 154. The ground shield 152 of the cable module 108 is configured to be coupled to the cables 150 to provide electrical shielding for the cables 150 and the signal contacts 154. The housing 106 holds the cables 150, the ground shield 152 and the signal contacts 154.

The housing 106 is manufactured from a dielectric material, such as a plastic material. In various embodiments, the housing 106 is a multipiece housing including an upper shell 170 and a lower shell 172. The lower shell 172 includes cable channels 174 receiving corresponding cables 150 and contact channels 176 receiving corresponding ground beams 156 and signal beams 158 of the ground shield 152 and the signal contacts 154, respectively. In various embodiments, the upper shell 170 is secured to the lower shell 172 in a pocket 178 in the lower shell 172 using securing features, such as clips, fasteners, heat stakes, and the like. In other various embodiments, the upper shell 170 may be formed in place on the lower shell 172 around the cable module 108. For example, the upper shell 170 may be molded into the pocket 178 around the cable module 108.

Each cable 150 includes at least one cable conductor 180, an insulator 182 holding the at least one cable conductor 180, a cable shield 184 surrounding the insulator 182 to provide electrical shielding for the at least one cable conductor 180, and an outer jacket 186 surrounding the cable shield 184. In the illustrated embodiment, each cable 150 includes a pair of the cable conductors 180 configured to transmit differential signals. Optionally, a single insulator 182 may hold the pair of cable conductors 180. In other various embodiments, each cable conductor 180 may include a separate insulator 182 surrounded by the cable shield 184 and the outer jacket 186. Optionally, the cables 150 may be loaded into corresponding cable channels 174 of the housing 106 from above through the top end 162 of the housing 106.

In an exemplary embodiment, the ground shield 152 is configured to be electrically connected to the cable shields 184 of each of the cables 150. The ground shield 152 electrically commons the cable shields 184 of each of the cables 150. In various embodiments, the ground shield 152 is soldered to the cable shields 184. In other various embodiments, the ground shield 152 may be welded to the cable shields 184, crimped to the cable shields 184 or engage the cable shields 184 by an interference fit. In an exemplary embodiment, the ground shield 152 includes one or more ground plates 190 extending along each of the cables 150 being electrically connected to each of the cable shields 184. In the illustrated embodiment, the ground shield 152 is a multipiece ground shield including an upper ground shield member 192 and a lower ground shield member 194 each formed from a corresponding ground plate 190. The upper and lower ground shield members 192, 194 may be shaped to receive the cables 150. For example, the upper and lower ground shield members 192, 194 may include corresponding cable channels 196. The upper and lower ground shield members 192, 194 may include pads 198 between the cable channels 196. Optionally, the pads 198 of the upper ground shield member 192 may engage and/or be coupled to the corresponding pads 198 of the lower ground shield member 194. The pads 198 may be coupled to the housing 106 to secure the ground shield 152 to the housing 106. For example, one or more of the pads 198 may include openings that receive securing features of the housing 106 to secure the ground shield 152 to the housing 106. Optionally, the ground shield 152 may be coupled to the cables 150 prior to loading the cables 150 and the ground shield 152 into the housing 106.

In an exemplary embodiment, the ground beams 156 are electrically connected to the ground shield 152. In various embodiments, the ground beams 156 may be integral with the ground shield 152, such as with the lower ground shield member 194 and/or the upper ground shield member 192. For example, the ground beams 156 may be stamped and formed with the ground plate 190. In other various embodiments, the ground beams 156 may be welded or otherwise mechanically and electrically connected to the ground plate 190. Each ground beam 156 includes a ground mating interface 200 configured to be coupled to the circuit board 104 (shown in FIG. 3). For example, the ground mating interface 200 may be electrically connected to the corresponding circuit board contact 149 on the circuit board 104. In an exemplary embodiment, each ground beam 156 includes a deflectable spring beam 202 being cantilevered forward from the ground plate 190. The spring beam 202 has a mating end 204 defining the ground mating interface 200. The spring beams 202 are angled downward for positioning the ground mating interfaces 200 at the mounting end 160 of the housing 106. The spring beams 202 are configured to be compressed against the circuit board 104 when the cable assembly 102 is mounted to the circuit board 104. The ground mating interfaces 200 may form separable interfaces with the circuit board 104. Optionally, the ground beams 156 may be loaded into the corresponding contact channels 176 from above through the top end 162 of the housing 106.

Each signal beam 158 includes a signal mating interface 210 configured to be coupled to the circuit board 104. For example, the signal mating interface 210 may be electrically connected to the corresponding circuit board contact 149 on the circuit board 104. In an exemplary embodiment, each signal beam 158 includes a deflectable spring beam 212 extending between a mating end 214 and a terminating end 216. The mating end 214 defines the signal mating interface 210. In an exemplary embodiment, the terminating end 216 includes a terminating pad 218 configured to be terminated to the corresponding cable conductor 180. For example, the terminating pad 218 may be a solder pad or weld pad. In other various embodiments, the terminating end 216 may include a crimp barrel configured to be crimped to the corresponding cable conductor 180. The mating ends 214 of the spring beams 212 are angled downward relative to the terminating ends 216 for positioning the signal mating interfaces 210 at the mounting end 160 of the housing 106. The spring beams 212 are configured to be compressed against the circuit board 104 when the cable assembly 102 is mounted to the circuit board 104. The signal mating interfaces 210 may form separable interfaces with the circuit board 104. Optionally, the signal contacts 154 may be loaded into the corresponding contact channels 176 of the housing 106 through the front 164. In other various embodiments, the signal contacts 154 may be loaded into the housing 106 from another direction, such as through the mounting end 160 or the top end 162.

Figure 5:
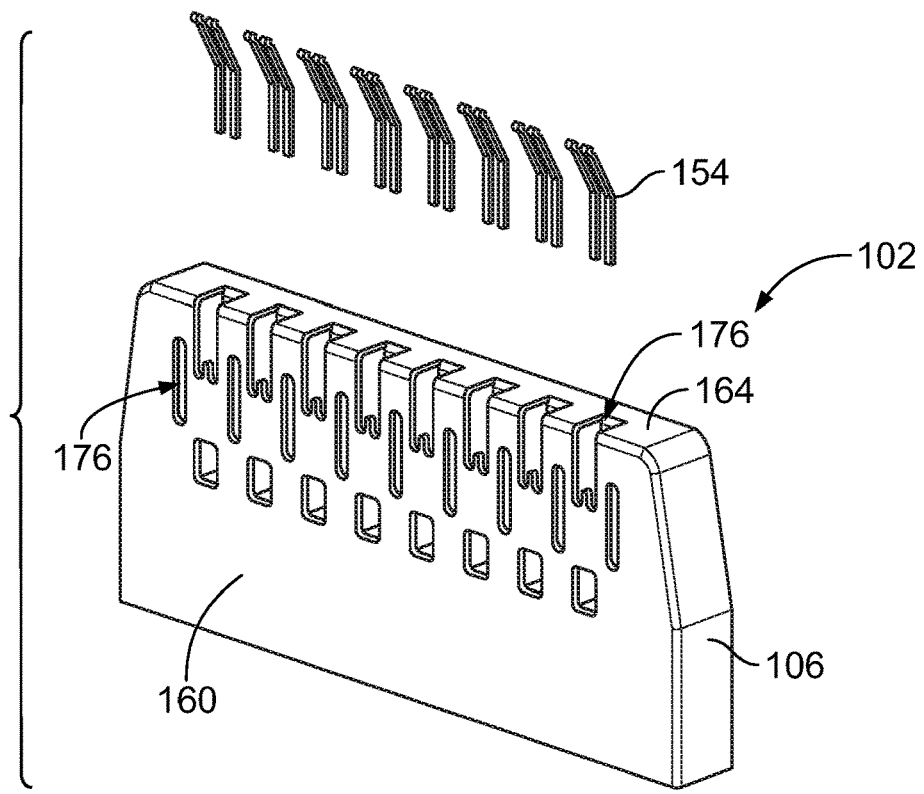
FIG. 5 is a bottom perspective view of a portion of the cable assembly showing the signal contacts poised for loading into the housing in accordance with an exemplary embodiment.

FIG. 5 is a bottom perspective view of a portion of the cable assembly 102 showing the signal contacts 154 poised for loading into the housing 106. The signal contacts 154 are configured to be loaded into corresponding contact channels 176 in the housing 106. Optionally, the contact channels 176 may be open at the front 164 and/or the mounting end 160 of the housing 106 for loading the signal contacts 154 into the housing 106. The signal contacts 154 may be stitched into the housing 106 during an assembly process.

Figure 6:
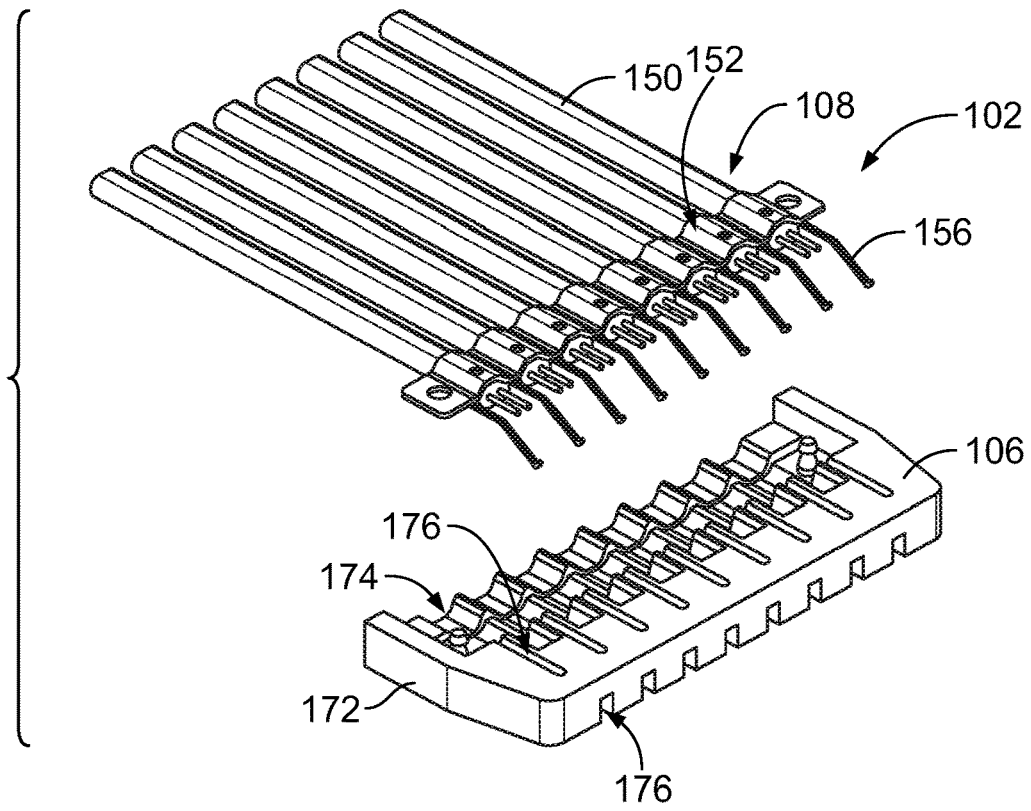
FIG. 6 is a top perspective view of a portion of the cable assembly showing the cables and the ground shield of the cable module poised for loading into the lower shell of the housing in accordance with an exemplary embodiment.

FIG. 6 is a top perspective view of a portion of the cable assembly 102 showing the cables 150 and the ground shield 152 of the cable module 108 poised for loading into the lower shell 172 of the housing 106. The cables 150 are configured to be received in corresponding cable channels 174. The ground beams 156 of the ground shield 152 are configured to be loaded into corresponding contact channels 176.

Figure 7:
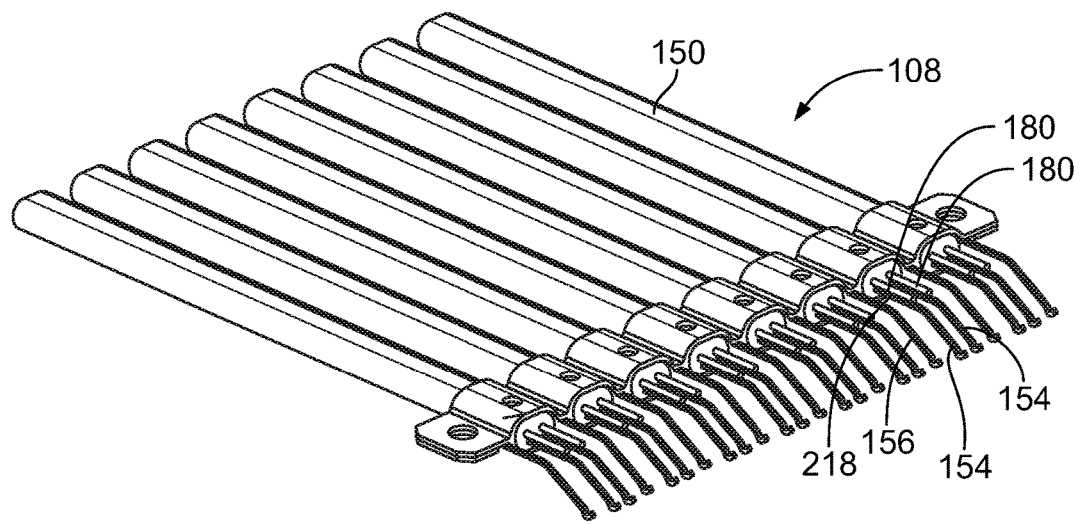
FIG. 7 is a front perspective view of the cable module in accordance with an exemplary embodiment.

FIG. 7 is a front perspective view of the cable module 108 in accordance with an exemplary embodiment. FIG. 7 illustrates the signal contacts 154 terminated to corresponding cable conductors 180 of the cables 150. The terminating pads 218 may be soldered or welded to the exposed cable conductors 180. In an exemplary embodiment, the signal contacts 154 are arranged in pairs with ground beams 156 positioned between the pairs of signal contacts 154. The ground beams 156 provide electrical shielding between the corresponding pairs of signal contacts 154.

Figure 8:
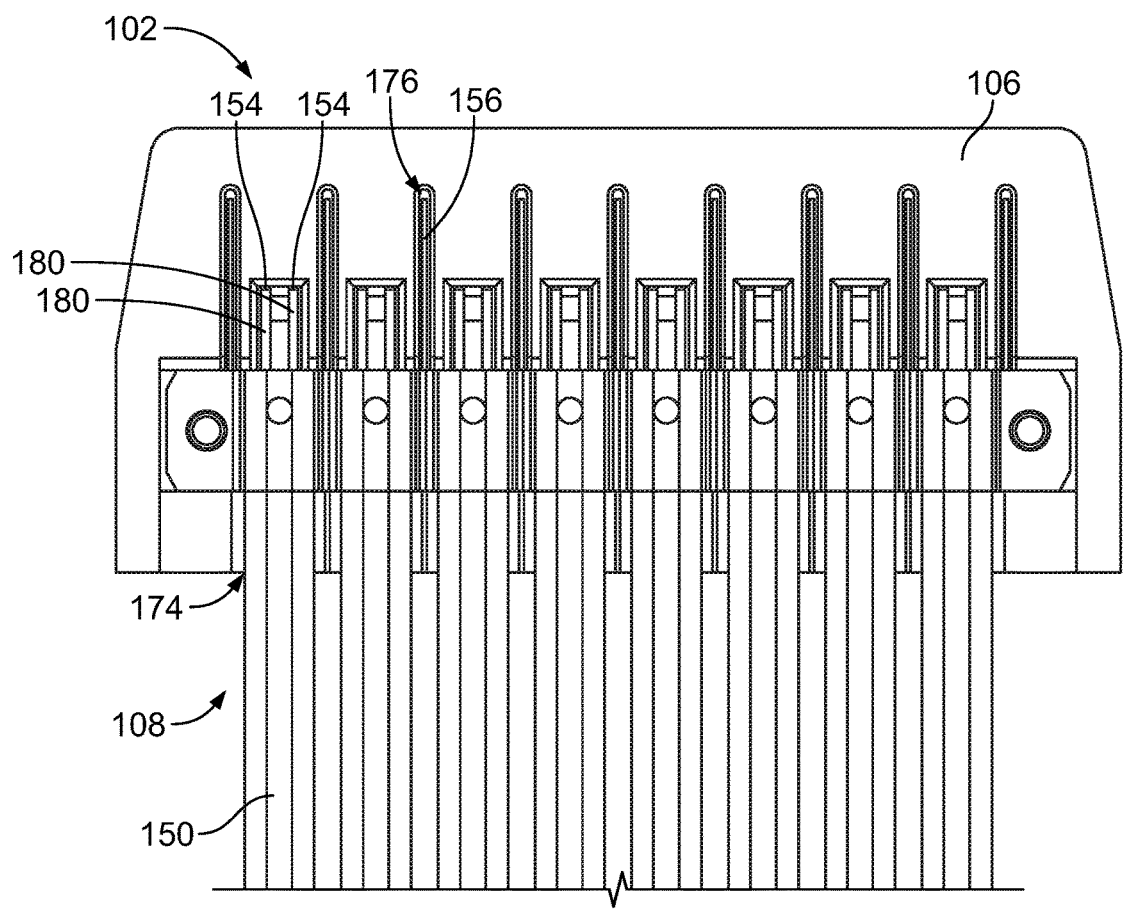
FIG. 8 is a top view of a portion of the cable assembly showing the cable module loaded into the housing in accordance with an exemplary embodiment.

FIG. 8 is a top view of a portion of the cable assembly 102 showing the cable module 108 loaded into the housing 106. The cables 150 are positioned in corresponding cable channels 174. The ground beams 156 are received in corresponding contact channels 176. In an exemplary embodiment, the exposed portions of the cable conductors 180 and the terminating pads 218 of the signal contacts 154 are accessible from above and/or below through the housing 106 for electrical connection of the signal contacts 154 to the cable conductors 180. For example, the terminating pads 218 of the signal contacts 154 and the cable conductors 180 are accessible for laser welding implements to laser weld the cable conductors 180 to the terminating pads 218.

Figure 9:
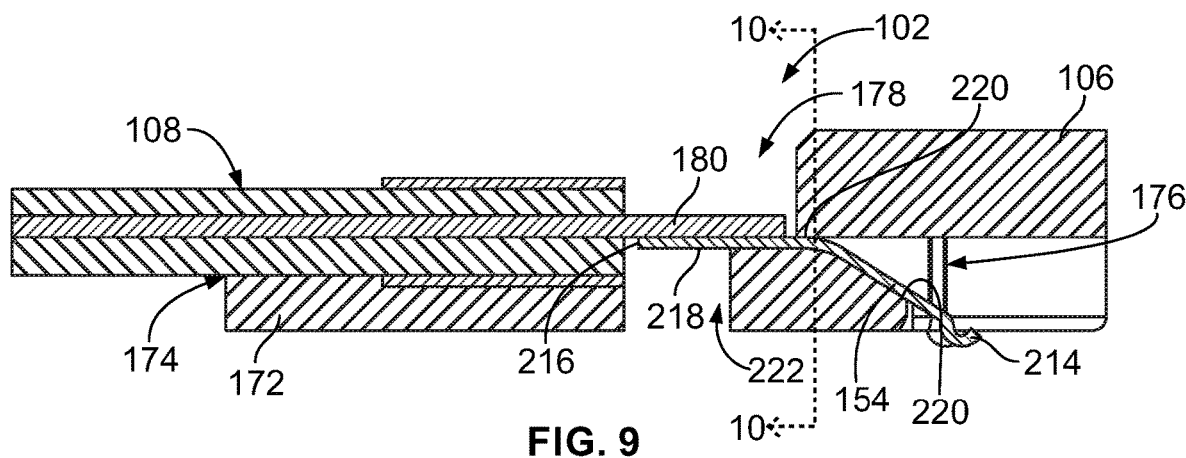
FIG. 9 is a side cross-sectional view of a portion of the cable assembly showing the cable module loaded into the lower shell of the housing in accordance with an exemplary embodiment.

FIG. 9 is a side cross-sectional view of a portion of the cable assembly 102 showing the cable module 108 loaded into the lower shell 172 of the housing 106. FIG. 9 illustrates the cable conductor 180 terminated to the signal contact 154. The signal contact 154 is received in the corresponding contact channel 176.

The lower shell 172 includes support walls 220 for supporting the signal contact 154 in the cable channel 174. The support walls 220 support the mating end 214 and the terminating end 216. In an exemplary embodiment, the lower shell 172 of the housing 106 includes an opening 222 at the bottom of the lower shell 172. The opening 222 is aligned with the terminating pad 218. The opening 222 provides access to the terminating pad 218 for laser welding implements to laser weld the cable conductor 180 to the terminating pad 218. The cable conductor 180 is accessible from above through the pocket 178.

Figure 10:
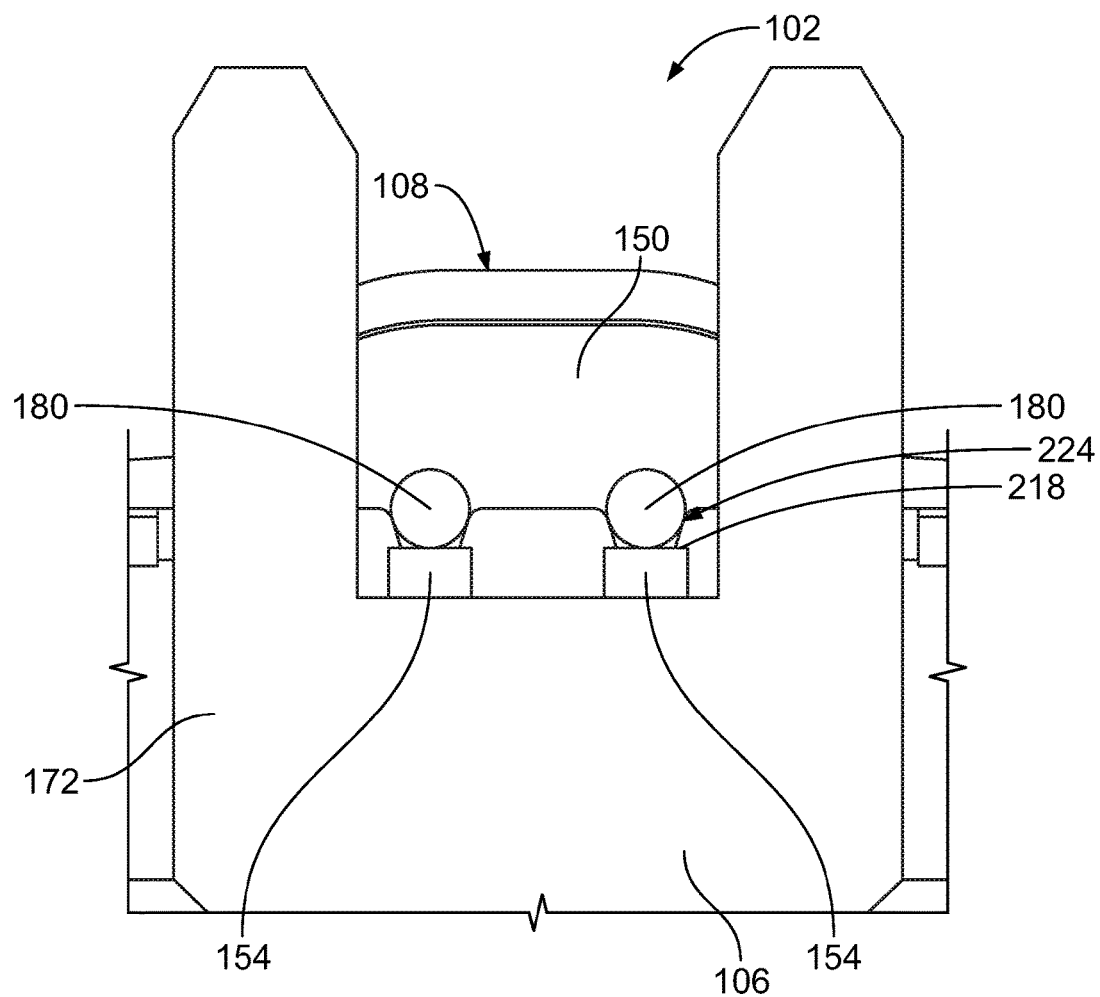
FIG. 10 is a front cross-sectional view of a portion of the cable assembly taken along line 10-10 shown in FIG. 9 showing the cable module loaded into the lower shell of the housing in accordance with an exemplary embodiment.

FIG. 10 is a front cross-sectional view of a portion of the cable assembly 102 taken along line 10-10 shown in FIG. 9 showing the cable module 108 loaded into the lower shell 172 of the housing 106. FIG. 10 illustrates the pair of cable conductors 180 of the cable 150 terminated to the corresponding signal contacts 154. The cable conductors 180 are received in corresponding conductor channels 224 to position the cable conductors 180 relative to the terminating pads 218 of the signal contacts 154. The cable conductors 180 are accessible from above, such as for access by laser welding implements to laser weld the cable conductors 180 to the terminating pads 218.

Figure 11:
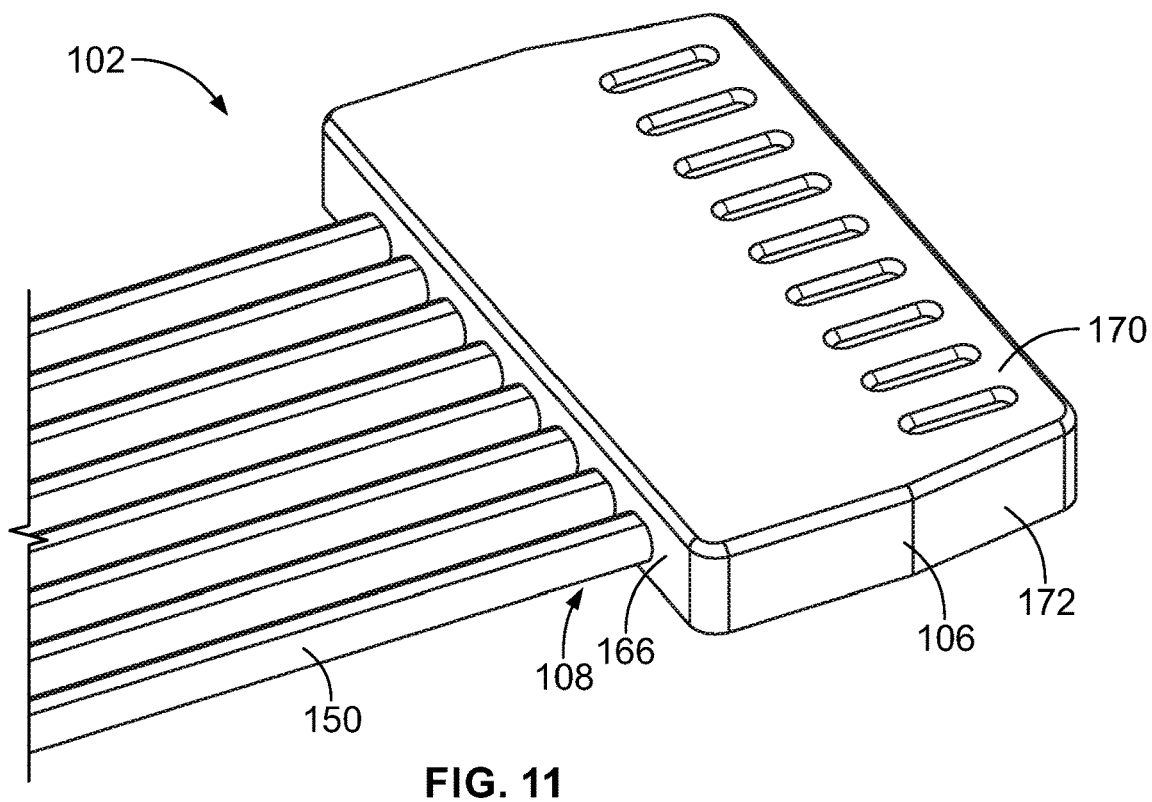
FIG. 11 is a perspective view of the cable assembly in accordance with an exemplary embodiment.

FIG. 11 is a perspective view of the cable assembly 102 in accordance with an exemplary embodiment. The upper shell 170 is coupled to the lower shell 172 to enclose the cable module 108. The cables 150 extend rearward from the cable end 166 of the housing 106. The upper shell 170 covers the ground shield 152 and ends of the cables 150 (both shown in FIG. 8).

Figure 12:
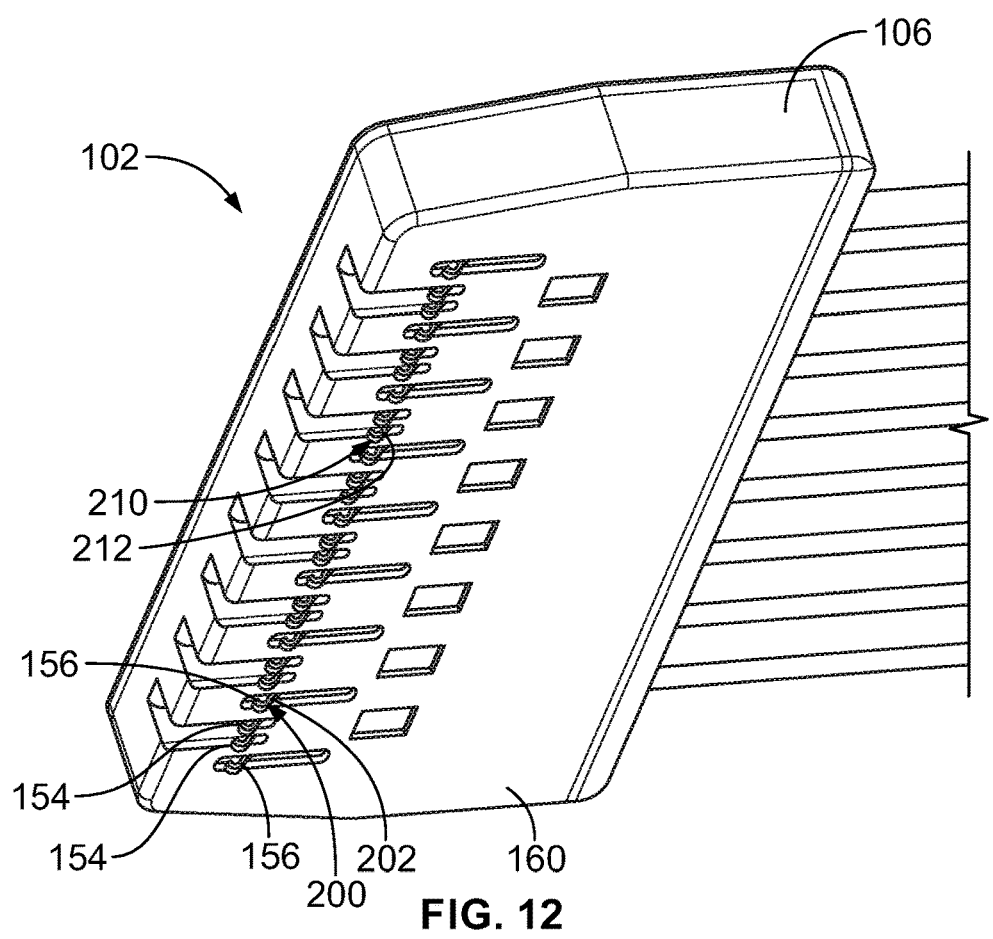
FIG. 12 is a bottom perspective view of the cable assembly in accordance with an exemplary embodiment.

FIG. 12 is a bottom perspective view of the cable assembly 102 in accordance with an exemplary embodiment. The spring beams 202 of the ground beams 156 and the spring beams 212 of the signal contacts 154 extend through the housing 106 and are exposed at the mounting end 160 of the housing 106 for electrical connection to the circuit board 104 (shown in FIG. 3). The ground mating interfaces 200 and the signal mating interfaces 210 are configured to be electrically connected to the circuit board 104. The spring beams 202, 212 may be compressed when the mounting end 160 is coupled to the circuit board 104 such that the spring beams 202, 212 are spring biased against the circuit board 104 to maintain an electrical connection with the circuit board 104.

Figure 13:
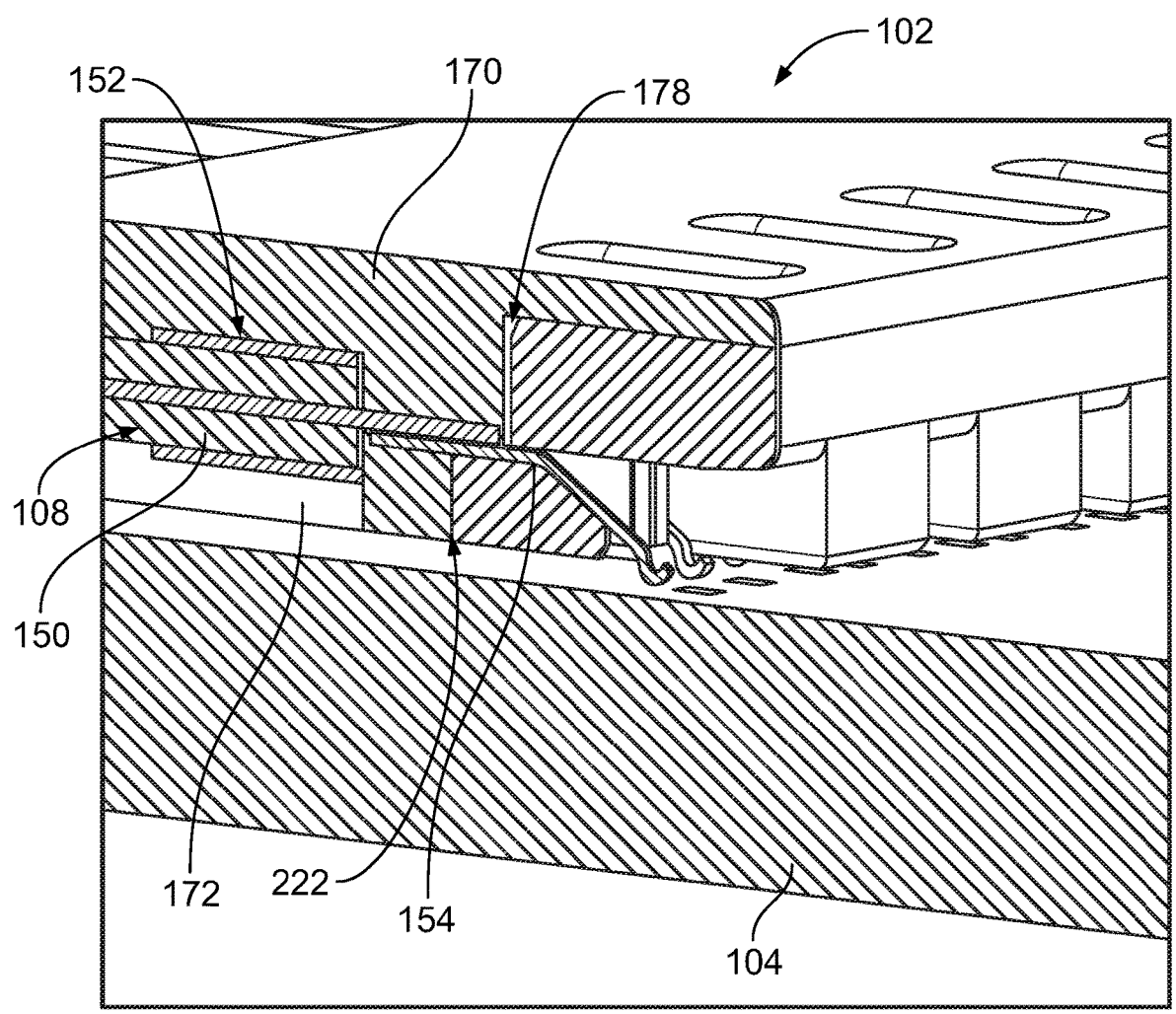
FIG. 13 is a front perspective, partial sectional view of the cable assembly poised for coupling to the circuit board in accordance with an exemplary embodiment.

FIG. 13 is a front perspective, partial sectional view of the cable assembly 102 poised for coupling to the circuit board 104 in accordance with an exemplary embodiment. FIG. 13 illustrates the upper shell 170 coupled to the lower shell 172. The upper shell 170 covers the cable module 108. For example, the upper shell 170 covers the cables 150, the ground shield 152, and may cover the signal contacts 154. The upper shell 170 may provide strain relief for the cables 150. Optionally, the upper shell 170 may be molded in place around the cable module 108 on the lower shell 172. In various embodiments, the upper shell 170 may fill the pocket 178 and the opening 222 in the lower shell 172.

Figure 14:
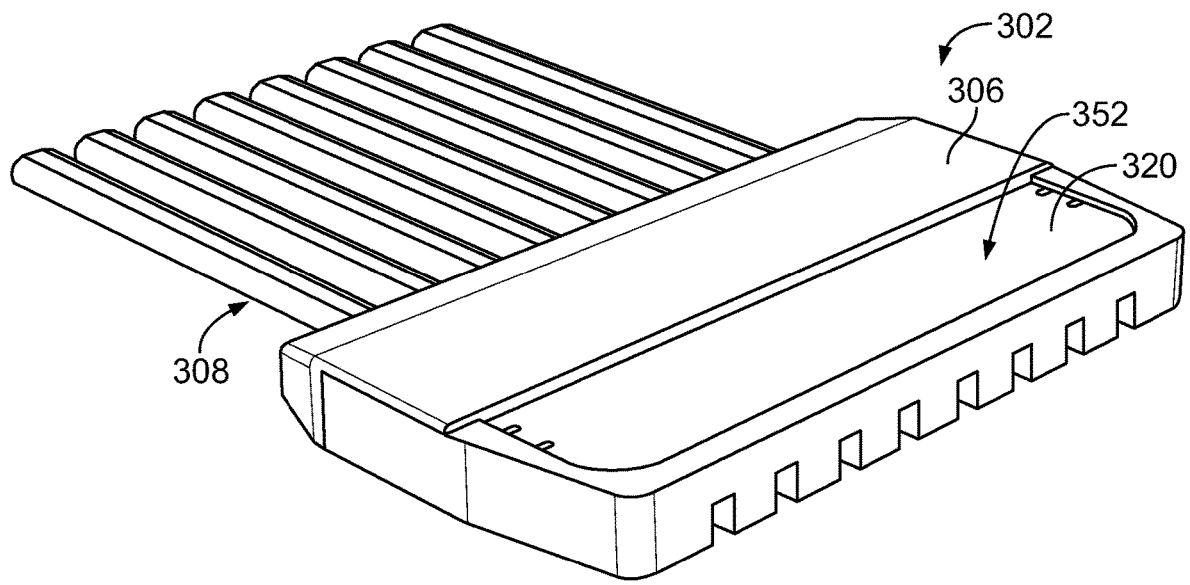
FIG. 14 is a front perspective view of a cable assembly in accordance with an exemplary embodiment.

FIG. 14 is a front perspective view of a cable assembly 302 in accordance with an exemplary embodiment. The cable assembly 302 may be similar to the cable assembly 102 (shown in FIG. 1). The cable assembly 302 includes a cable module 308 having an alternative ground shield 352 compared to the ground shield 152 (shown in FIG. 4) for providing electrical shielding for the cable assembly 302. The ground shield 352 includes a ground plate 320 held in a housing 306 of the cable assembly 302.

Figure 15:
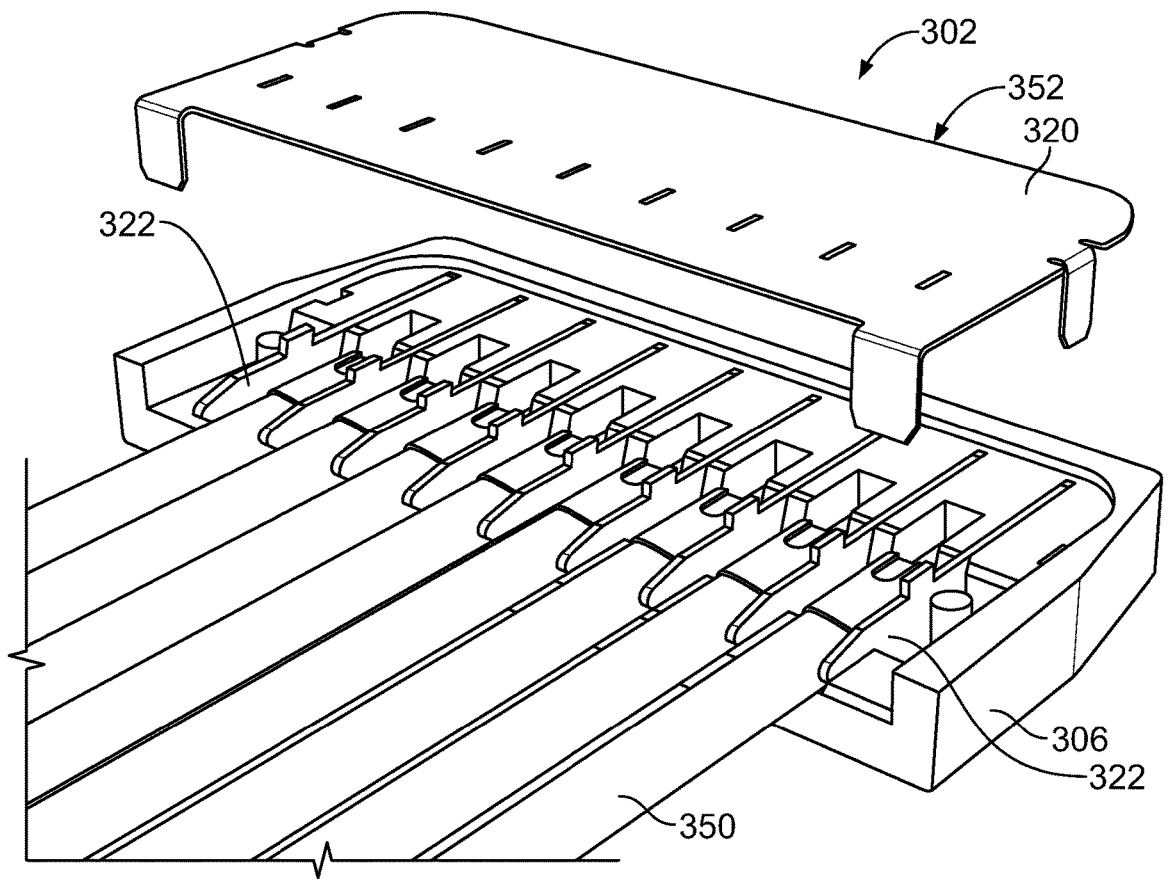
FIG. 15 is a rear perspective, exploded view of the cable assembly in accordance with an exemplary embodiment.

FIG. 15 is a rear perspective, exploded view of the cable assembly 302 in accordance with an exemplary embodiment. The housing 306 holds a plurality of cables 350. The ground shield 352 provides electrical shielding for the cables 350. In an exemplary embodiment, the ground shield 352 includes ground blades 322 located between each of the cables 350. The ground blades 322 are configured to be electrically connected to the ground plate 320 that extends over the tops of the cables 350.

Figure 16:
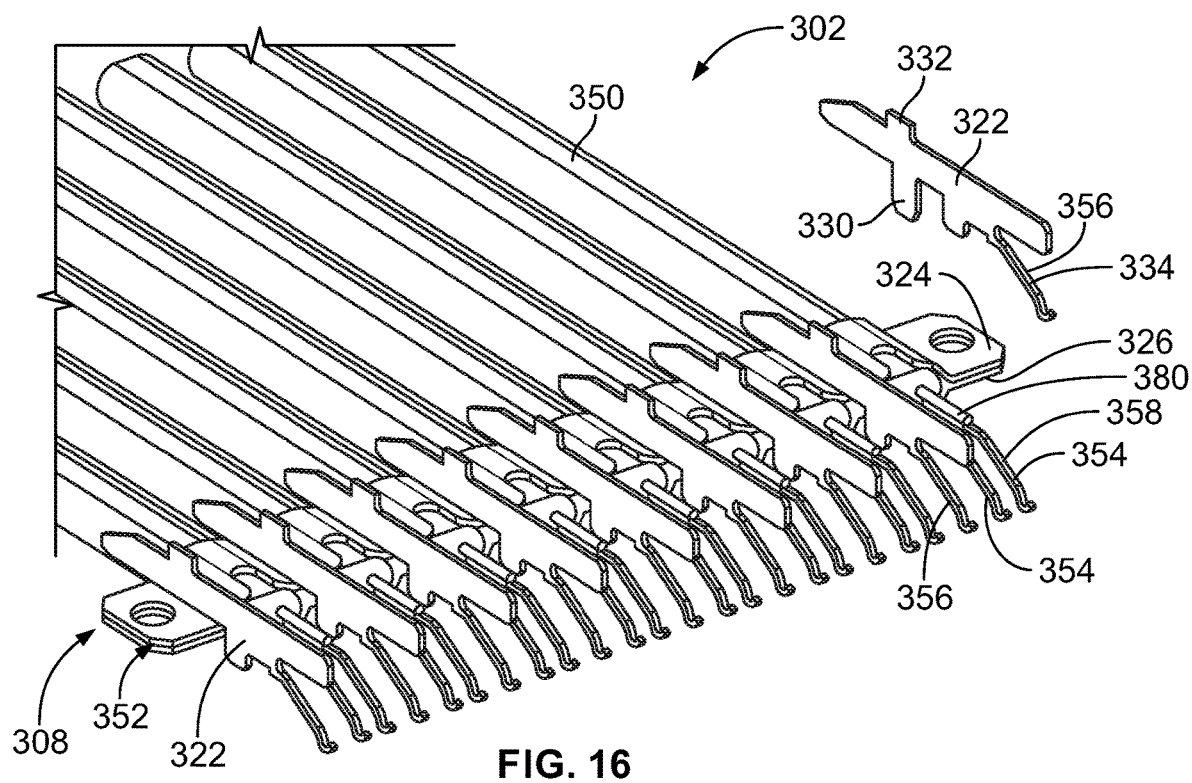
FIG. 16 is a front perspective view of a portion of the cable module showing the ground blades relative to the cables in accordance with an exemplary embodiment.
Figure 17:
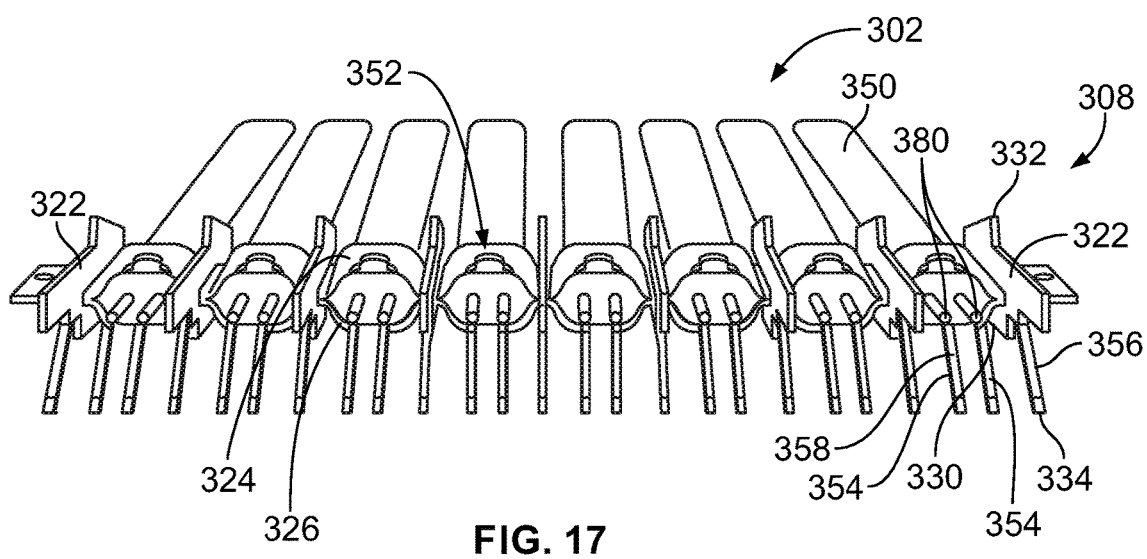
FIG. 17 is a front perspective view of a portion of the cable module in accordance with an exemplary embodiment.

FIG. 16 is a front perspective view of a portion of the cable module 308 showing the ground blades 322 relative to the cables 350 in accordance with an exemplary embodiment. FIG. 17 is a front perspective view of a portion of the cable module 308 in accordance with an exemplary embodiment. In an exemplary embodiment, the ground shield 352 includes an upper ground shield member 324 and a lower ground shield member 326. The upper ground shield member 324 is a conductive plate extending above and being electrically connected to each of the cables 350. The lower ground shield member 326 is a conductive plate extending below and being electrically connected to each of the cables 350. In various embodiments, the upper and lower ground shield members 324, 326 are electrically connected to cable shields of the cables 350.

The ground blades 322 are coupled to the upper ground shield member 324 and/or the lower ground shield member 326. In an exemplary embodiment, each ground blade 322 includes a mounting tab 330 for mechanically and electrically connecting the ground blade 322 to the upper ground shield member 324 and/or the lower ground shield member 326. In various embodiments, each ground blade 322 includes a mounting tab 332 extending from the top of the ground blade 322 for mechanically and electrically connecting the ground blade 322 to the ground plate 320 (shown in FIG. 15). In an exemplary embodiment, each ground blade 322 includes a ground beam 356 extending therefrom. The ground beam 356 may be a deflectable spring beam having a ground mating interface 334 at a distal end of the spring beam. The ground blades 322 may have different sizes or shapes in alternative embodiments.

The cable module 308 includes signal contacts 354 terminated to corresponding cable conductors 380 of the cables 350. The signal contacts 354 include signal beams 358 configured to be electrically connected to the circuit board 104 (shown in FIG. 1). The signal beams 358 and the ground beams 356 may define separable mating interfaces with the circuit board 104. For example, the ground beams 356 and the signal beams 358 may be spring biased against the circuit board 104 when the cable assembly 302 is compressed against the circuit board 104.

Figure 18:
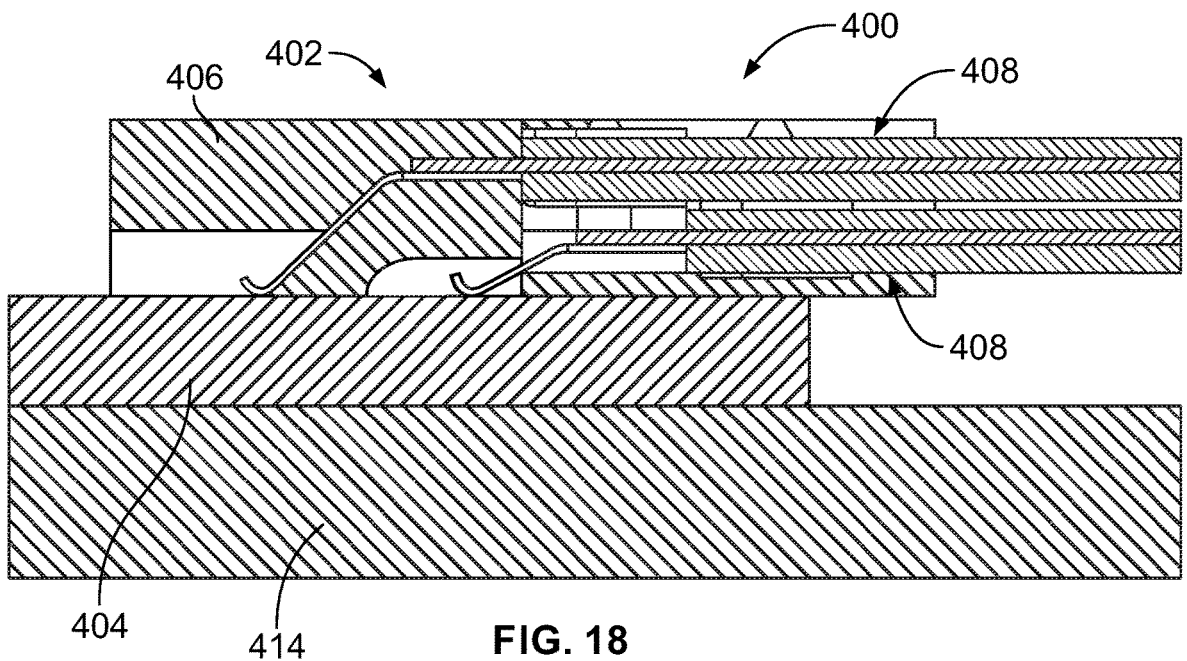
FIG. 18 is a cross-sectional view of a communication system illustrating a cable assembly in accordance with an exemplary embodiment.
Figure 19:
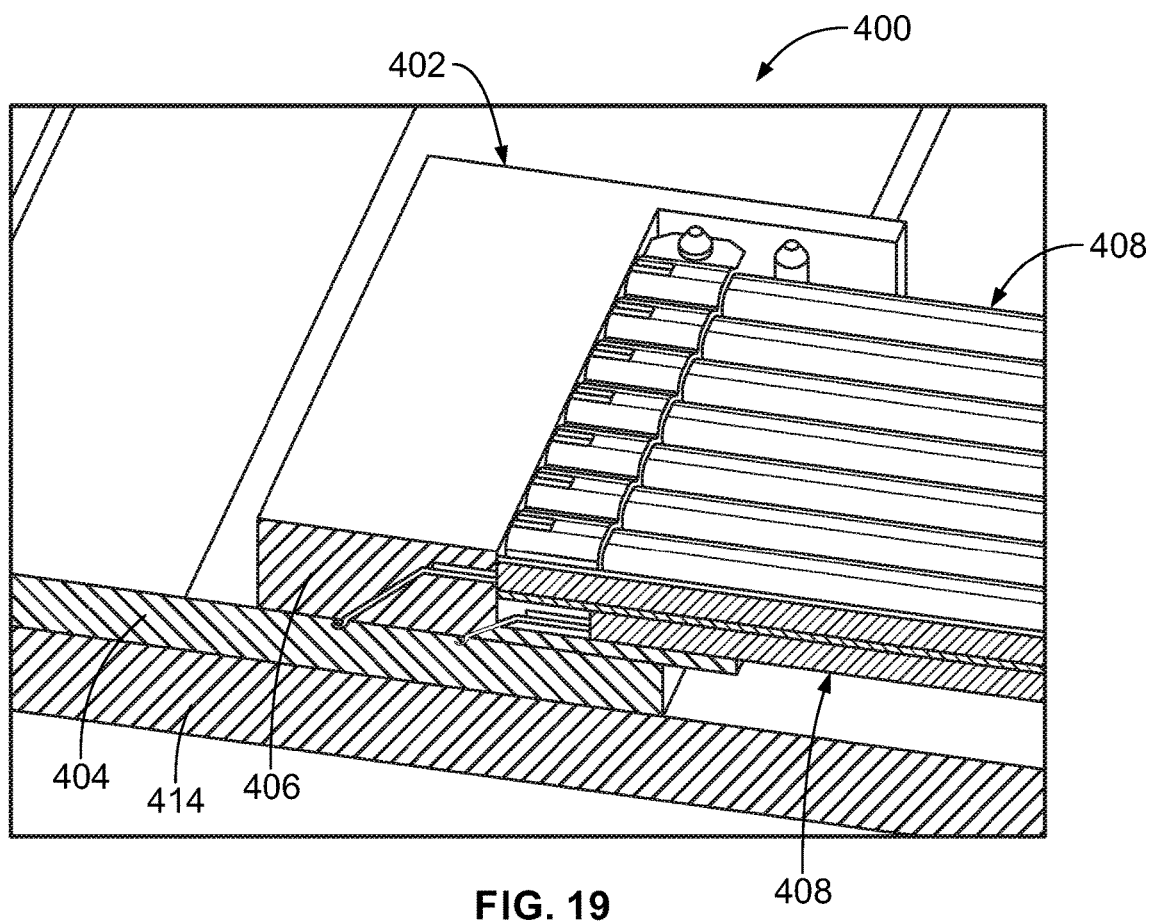
FIG. 19 is a top perspective, partial sectional view of the cable assembly in accordance with an exemplary embodiment.

FIG. 18 is a cross-sectional view of a communication system 400 illustrating a cable assembly 402 in accordance with an exemplary embodiment. FIG. 19 is a top perspective, partial sectional view of the cable assembly 402 in accordance with an exemplary embodiment. The cable assembly 402 is electrically connected to a communication component 404, such as a circuit board. In the illustrated embodiment, the communication component 404 is coupled to a host circuit board 414. The cable assembly 402 is similar to the cable assembly 102 (shown in FIG. 1); however, the cable assembly 402 includes multiple cable modules 408 received in a housing 406. In the illustrated embodiment, the cable assembly 402 includes two cable modules 408 held within the same housing 406. The cable modules 408 are stacked within the housing 406. The cable modules 408 form multiple (two) rows of signal and ground contacts configured to be electrically connected to the communication component 404. The cable assembly 402 includes similar features as the cable assembly 102.

Figure 20:
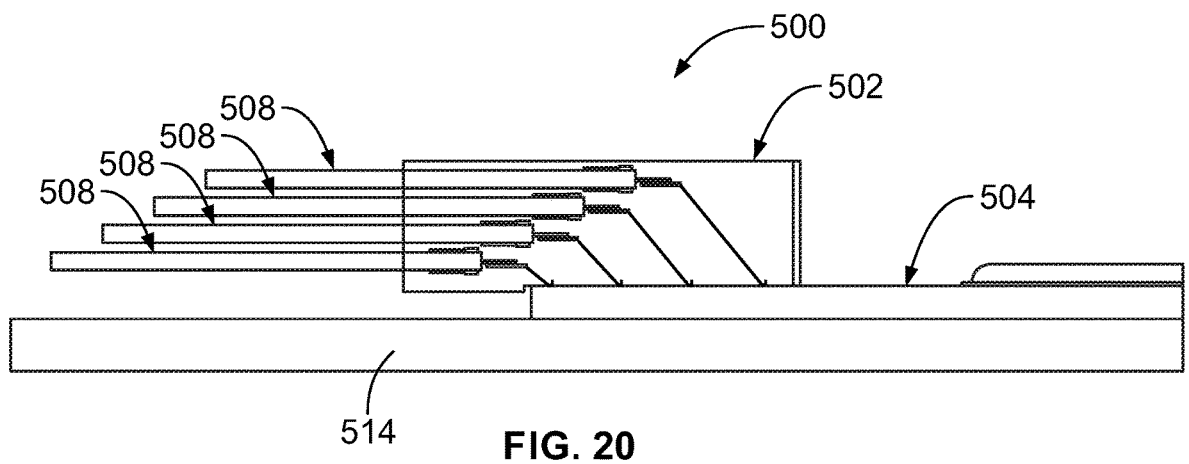
FIG. 20 is a cross-sectional view of the communication system illustrating a cable assembly in accordance with an exemplary embodiment.

FIG. 20 is a cross-sectional view of the communication system 500 illustrating a cable assembly 502 in accordance with an exemplary embodiment. The cable assembly 502 is electrically connected to a communication component 504, such as a circuit board. In various embodiments, the communication component 504 is an integrated circuit assembly, such as an ASIC. However, the communication component 504 may be another type of communication component, such as a processor, an interposer assembly, a socket assembly, a host circuit board assembly, and the like. In the illustrated embodiment, the communication component 504 is coupled to a host circuit board 514. The cable assembly 502 is similar to the cable assembly 102 (shown in FIG. 1); however, the cable assembly 502 includes multiple cable modules 508 received in a housing 506. In the illustrated embodiment, the cable assembly 502 includes four cable modules 508 received in the same housing 506. The cable modules 508 are stacked within the housing 506. The cable modules 508 form multiple (four) rows of signal and ground contacts configured to be electrically connected to the communication component 504. The cable assembly 502 includes similar features as the cable assembly 102.

Figure 21:
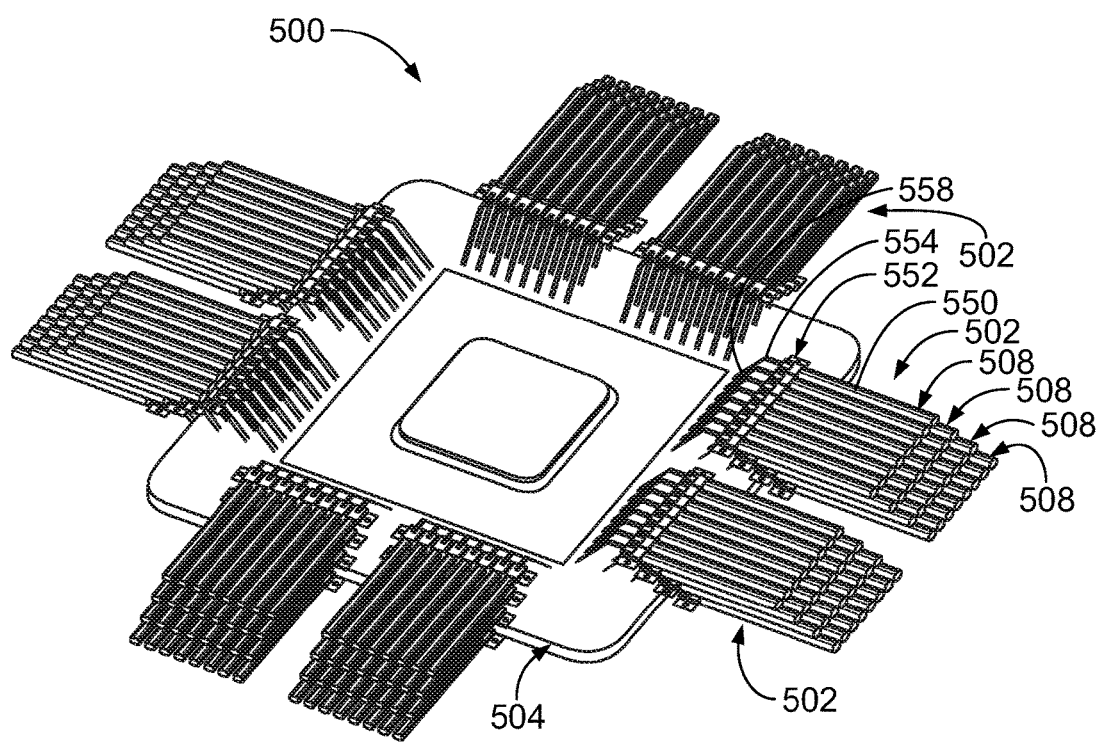
FIG. 21 is a top perspective view of the communication system in accordance with an exemplary embodiment.

FIG. 21 is a top perspective view of the communication system 500 in accordance with an exemplary embodiment illustrating a plurality of the cable assemblies 502 (with the housings 506 shown in FIG. 20 removed for clarity). The cable assemblies 502 are arranged around the communication component 504, such as on all four sides of a chip of the communication component 504. Each cable module 508 includes a plurality of cables 550, a ground shield 552 providing electrical shielding, and signal contacts 554 electrically connected to the cables 550. The signal contacts 554 include signal beams 558 defined by spring beams configured to be compressed against circuit board contacts on the upper surface of the communication component 504 to create an electrical connection with the communication component 504. The signal contacts 554 of the various cable modules 508 are arranged in corresponding rows for mating with corresponding rows of the circuit board contacts. The cable assemblies 502 form high density mating interfaces with the communication component 504. For example, in the illustrated embodiment, the eight cable assemblies 502, each having four cable modules 508, each having eight pairs of signal contacts 554 provides five hundred and twelve (512) signal paths with the communication component 504.

Figure 22:
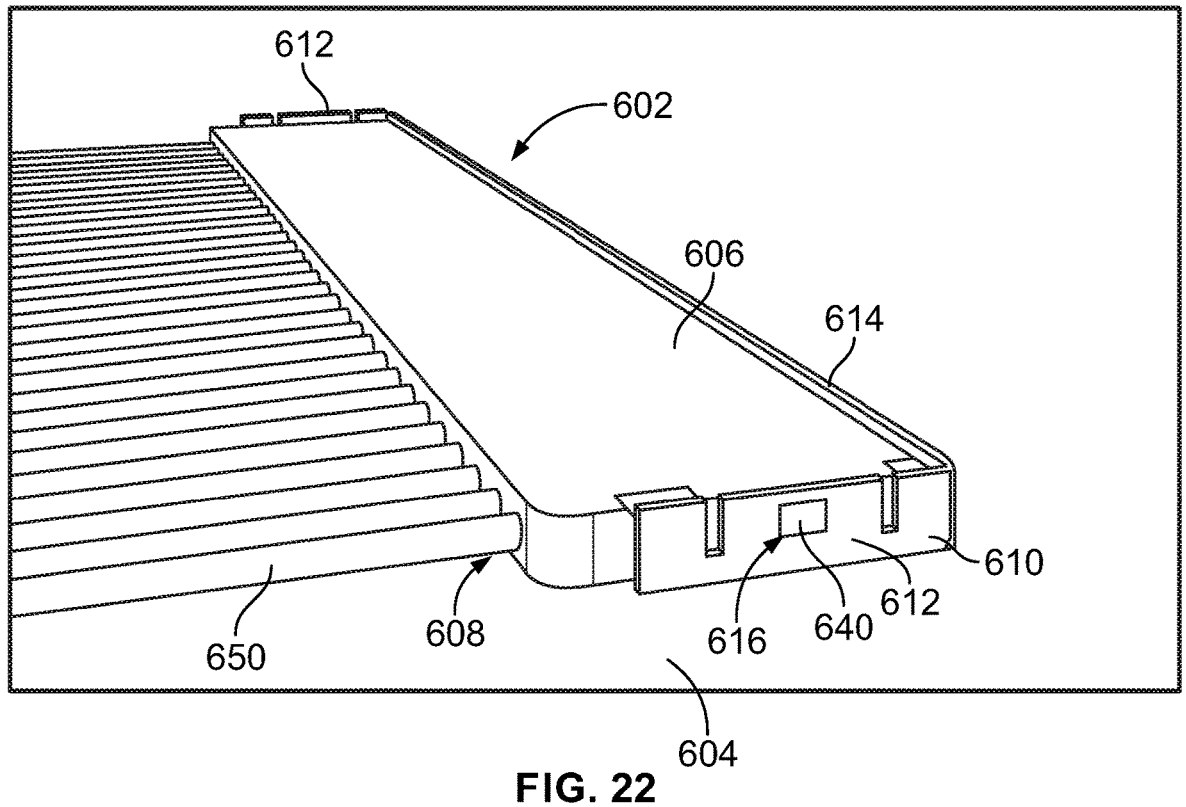
FIG. 22 is a rear perspective view of a cable assembly in accordance with an exemplary embodiment.
Figure 23:
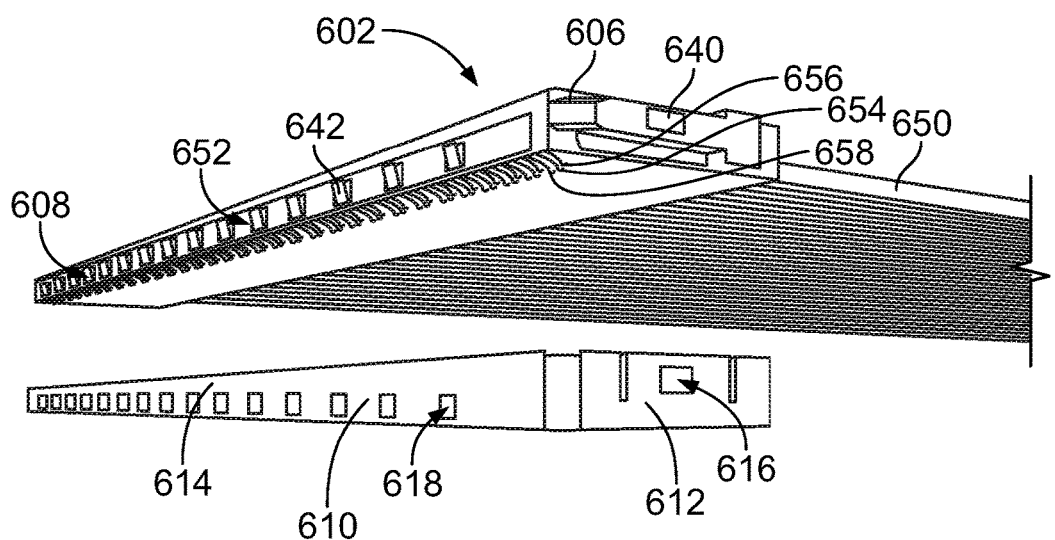
FIG. 23 is a front perspective view of the cable assembly in accordance with an exemplary embodiment.

FIG. 22 is a rear perspective view of a cable assembly 602 in accordance with an exemplary embodiment. FIG. 23 is a front perspective view of the cable assembly 602 in accordance with an exemplary embodiment. The cable assembly 602 may be similar to the cable assembly 102; however, the cable assembly 602 may include securing features for securing the cable assembly 602 to a communication component 604. The cable assembly 602 includes similar features as the cable assembly 102.

In the illustrated embodiment, the communication component 604 includes a mounting bracket 610 for securing the cable assembly 602 to the communication component 604. The mounting bracket 610 includes sidewalls 612 and an end wall 614 extending between the sidewalls 612. The sidewalls 612 include openings 616 that receive portions of the cable assembly 602 to locate and/or retain the cable assembly 602 in the mounting bracket 610. The end wall 614 includes openings 618 that receive portions of the cable assembly 602 to locate and/or retain the cable assembly 602 and the mounting bracket 610.

In an exemplary embodiment, the cable assembly 602 includes a housing 606 holding a cable module 608. The cable module 608 includes a plurality of cables 650, a ground shield 652 (FIG. 23), and signal contacts 654 (FIG. 23). In an exemplary embodiment, the housing 606 includes mounting tabs 640 configured to be received in corresponding openings 616 in the mounting bracket 610. In an exemplary embodiment, the ground shield 652 includes mounting tabs 642 configured to be received in corresponding openings 618 in the mounting bracket 610. The mounting tabs 642 may be spring tabs configured to be spring loaded into the openings 618. When the mounting tabs 642 engage the mounting bracket 610, the mounting tabs 642 may provide a downward biasing force for mounting the cable assembly 102 to the communication component 104. The downward biasing force is used to compress ground beams 656 of the ground shield 652 and signal beams 658 of the signal contacts 654 for electrically connecting the cable assembly 602 to the communication component 604.

Figure 24:
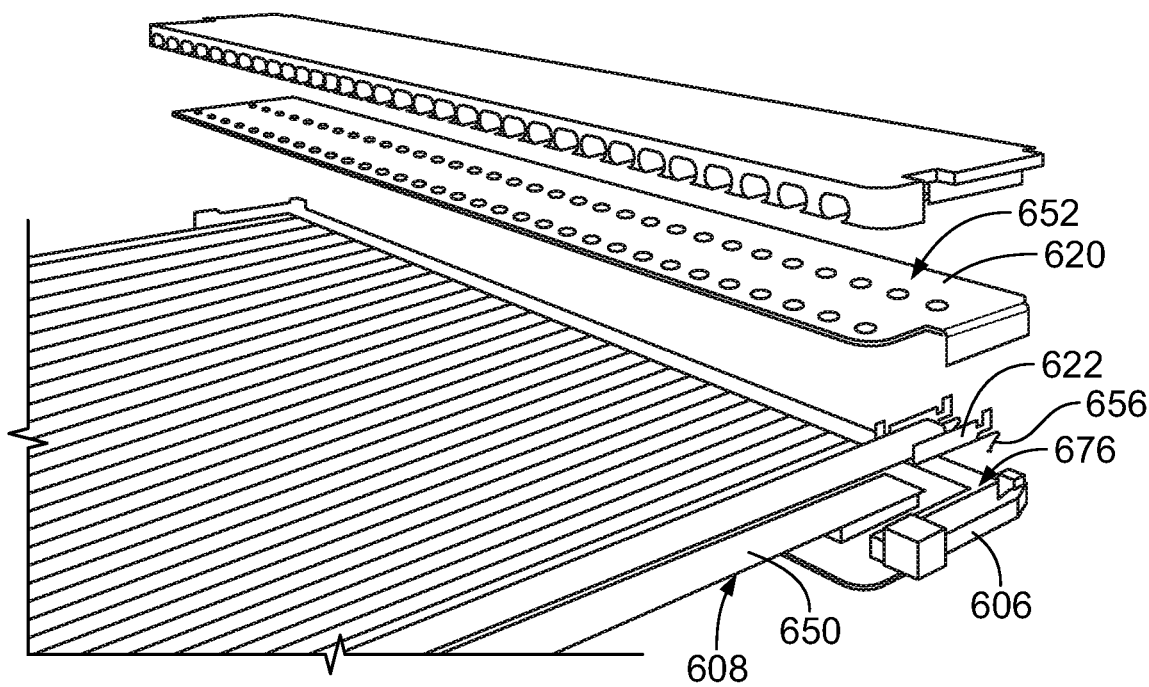
FIG. 24 is an exploded view of the cable module in accordance with an exemplary embodiment.
Figure 25:
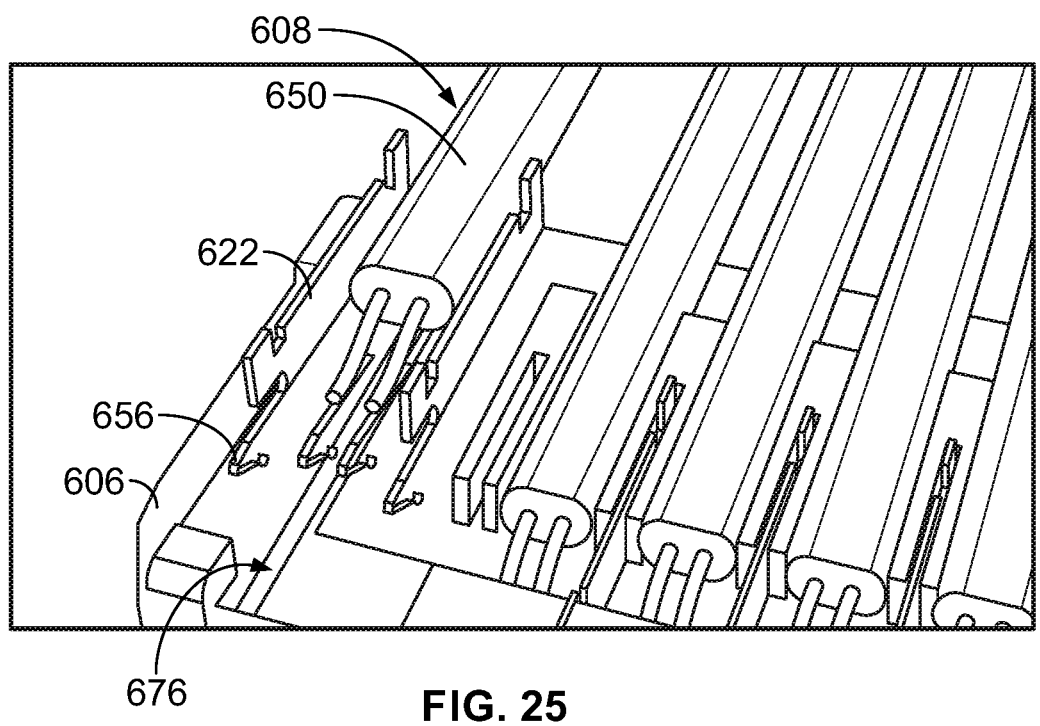
FIG. 25 is a top perspective view of a portion of the cable module in accordance with an exemplary embodiment.

FIG. 24 is an exploded view of the cable module 608 in accordance with an exemplary embodiment. FIG. 25 is a top perspective view of a portion of the cable module 608 in accordance with an exemplary embodiment. In an exemplary embodiment, the ground shield 652 includes a ground plate 620 and ground blades 622 providing electrical shielding for the cables 650. The ground plate 620 is configured to extend above each of the cables 650. In an exemplary embodiment, the ground plate 620 may be soldered or welded to cable shields of each of the cables 650. The ground blades 622 are configured to be electrically connected to the ground plate 620, such as being press-fit into slots or openings in the ground plate 620. The ground blades 622 include ground beams 656 extending therefrom. The ground beams 656 are configured to be received in contact channels 676 in the housing 606.

Figure 26:
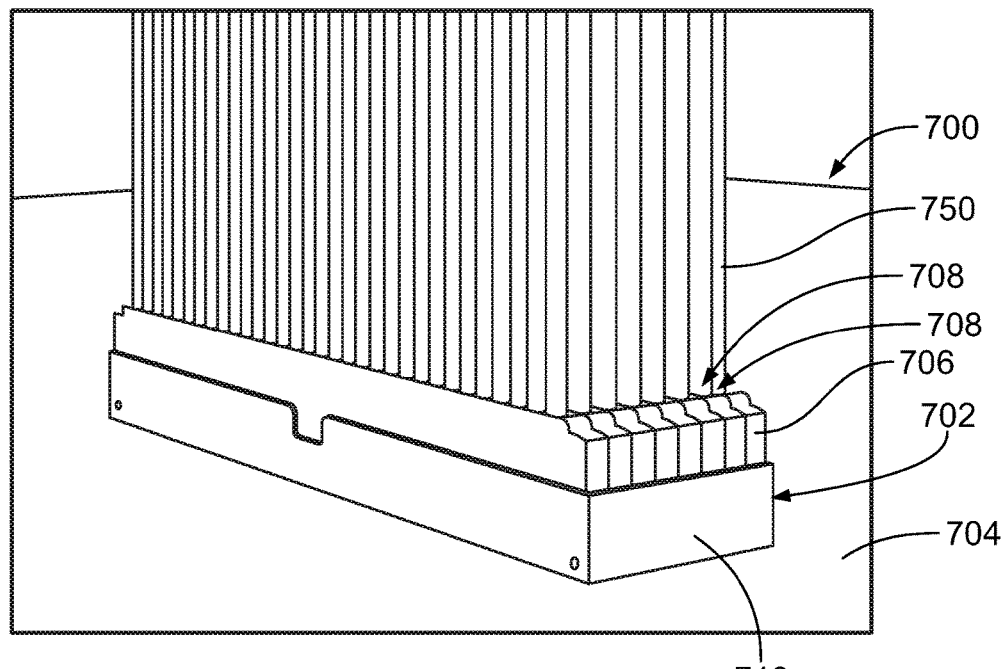
FIG. 26 is a perspective view of a communication system in accordance with an exemplary embodiment illustrating a cable assembly in accordance with an exemplary embodiment.

FIG. 26 is a perspective view of a communication system 700 in accordance with an exemplary embodiment illustrating a cable assembly 702 in accordance with an exemplary embodiment. The cable assembly 702 includes a plurality of cable modules 708 arranged in a stacked configuration and received in a mounting bracket 710 mounted to a communication component 704. In the illustrated embodiment, cables 750 of the cable modules 708 extending vertically from the top of the corresponding housing 706.

Figure 27:
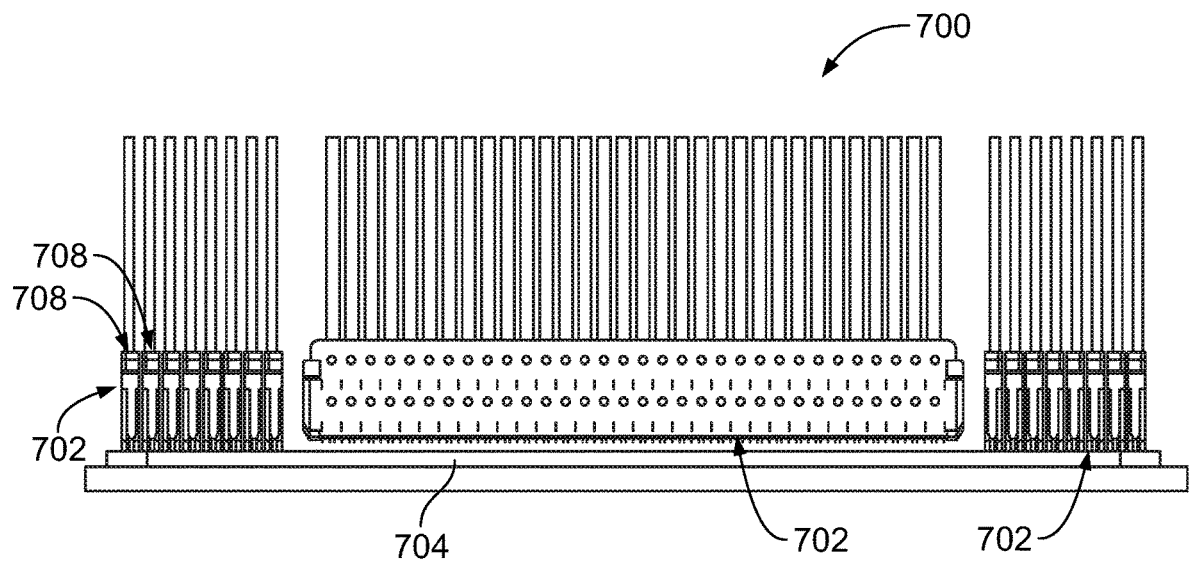
FIG. 27 is a side view of the communication system in accordance with an exemplary embodiment.

FIG. 27 is a side view of the communication system 700 in accordance with an exemplary embodiment illustrating a plurality of the cable assemblies 702 mounted to the communication component 704. Each cable assembly 702 may include any number of cable modules 708.

Figure 28:
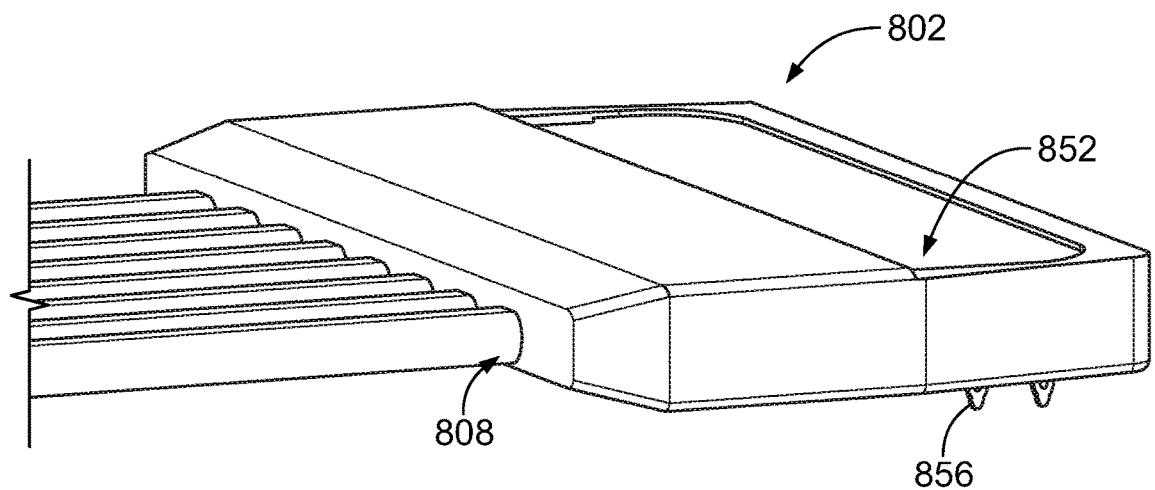
FIG. 28 is a front perspective view of a cable assembly in accordance with an exemplary embodiment.
Figure 29:
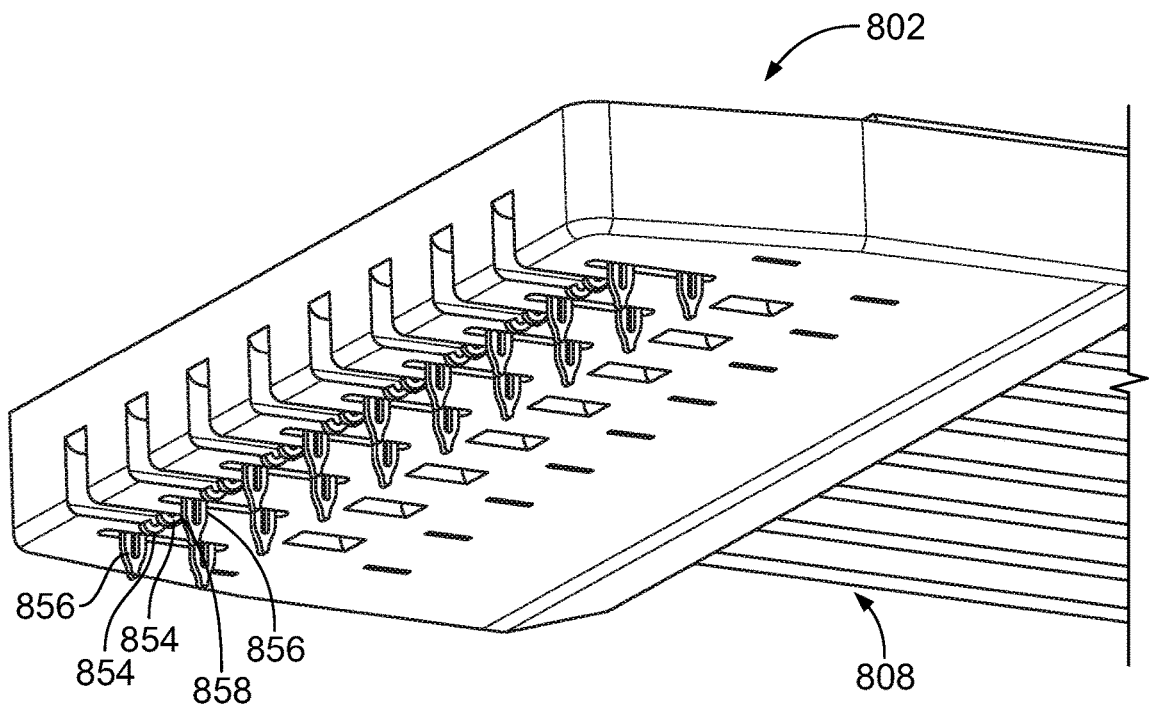
FIG. 29 is a bottom perspective view of a cable assembly in accordance with an exemplary embodiment.

FIG. 28 is a front perspective view of a cable assembly 802 in accordance with an exemplary embodiment. FIG. 29 is a bottom perspective view of a cable assembly 802 in accordance with an exemplary embodiment. The cable assembly 802 may be similar to the cable assembly 102 (shown in FIG. 1). The cable assembly 802 includes a cable module 808 having a ground shield 852 having alternative ground beams 856 compared to the ground beams 156 of the ground shield 152 (both shown in FIG. 4). The ground beams 856 include compliant pins configured to be press fit into the communication component 104 (shown in FIG. 30). In the illustrated embodiment, signal beams 858 of signal contacts 854 include spring beams defining a compressible, separable mating interface with a communication component 804 (shown in FIG. 30). However, in alternative embodiments, the signal beams 858 of the signal contacts 854 may be compliant pins rather than spring beams.

Figure 30:
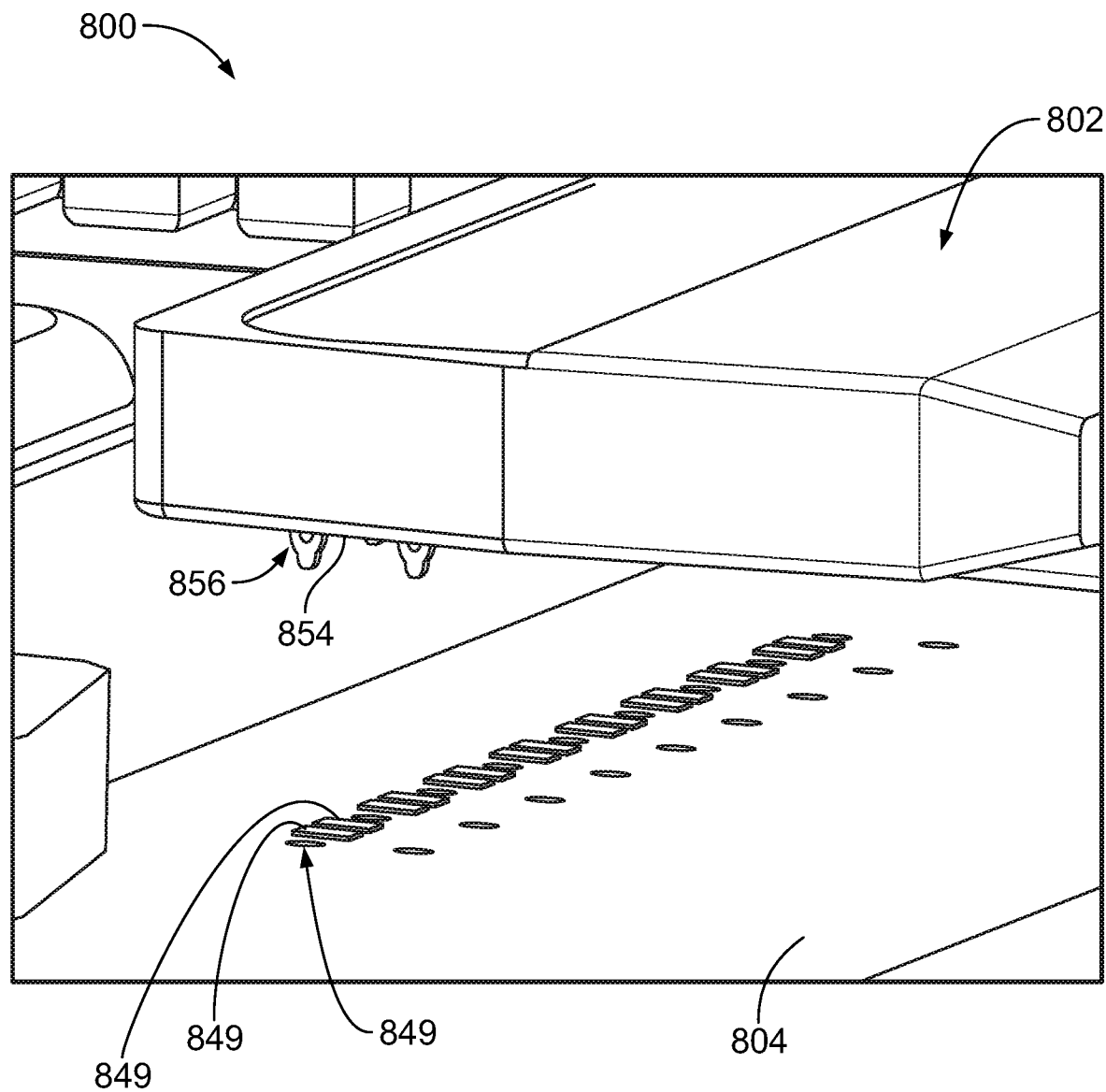
FIG. 30 is an exploded view of a portion of a communication system showing the cable assembly poised for coupling with the communication component in accordance with an exemplary embodiment.

FIG. 30 is an exploded view of a portion of a communication system 800 showing the cable assembly 802 poised for coupling with the communication component 804. The communication component 804 includes circuit board contacts 849 configured for electrical connection with the signal beams 858 and the ground beams 856. In the illustrated embodiment, the ground circuit board contacts 849 are plated vias configured to receive the compliant pins and the signal circuit board contacts 849 are pads configured to receive the spring beams of the signal contacts 854.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A communication system comprising:
a circuit board including a substrate having an upper surface and a lower surface, the circuit board including circuit board ground contacts and circuit board signal contacts on the upper surface; and
a cable assembly including a cable module and a housing holding the cable module, the cable module including cables, a ground shield electrically connected to the cables, and signal contacts electrically connected to the cables, each cable including a cable conductor, an insulator holding the cable conductor and a cable shield surrounding the insulator, the ground shield being electrically connected to the cable shield of each cable, the ground shield including ground beams extending to ground mating interfaces, the ground mating interfaces configured to be coupled to corresponding circuit board ground contacts on the circuit board, each signal contact having a terminating pad terminated to the corresponding cable conductor, each signal contact having a signal beam extending to a signal mating interface, the signal mating interfaces of the signal contacts configured to be coupled to corresponding circuit board signal contacts on the circuit board, the housing having a mounting end mounted to the circuit board, the housing including contact channels receiving the ground beams and the signal beams with the ground mating interfaces exposed at the mounting end of the housing for interfacing with the circuit board and with the signal mating interfaces exposed at the mounting end of the housing for interfacing with the circuit board.

2. The communication system of claim 1, wherein the circuit board includes upper contacts and lower contacts, the upper contacts being electrically connected to corresponding circuit board signal contacts, the lower contacts being electrically connected to host circuit board contacts of a host circuit board, the lower contact being electrically connected to corresponding upper contacts, the circuit board includes a chip mounted to the upper surface and electrically connected to the upper contacts, wherein first electrical signals are transmitted through the circuit board between the upper contacts and the circuit board signal contacts and wherein second electrical signals are transmitted through the circuit board between the upper contacts and the lower contacts.

3. The communication system of claim 1, wherein the signal mating interface of the signal beam and the ground mating interface of the ground beam define a separable interface for the cable module with the circuit board.

4. The communication system of claim 1, wherein the ground beam and the signal beam are deflectable spring beams being compressible against the circuit board.

5. The communication system of claim 1, wherein the terminating pads are welded to the cable conductors of the corresponding cables.

6. The communication system of claim 1, wherein the ground shield includes an upper ground shield member and a lower ground shield member, the upper ground shield member extending above each of the cables and being electrically connected to each of the cable shields, the lower ground shield member extending below each of the cables and being electrically connected to each of the cable shields, the upper ground shield member being coupled to the lower ground shield member.

7. The communication system of claim 1, wherein the ground shield includes a ground plate extending along each of the cables being electrically connected to each of the cable shields.

8. The communication system of claim 7, wherein the ground shield further comprises ground blades separate and discrete from the ground plate, the ground blades including corresponding ground beams, the ground blades being coupled to the ground plate, the ground blades being positioned between corresponding signal beams to provide electrical shielding between corresponding signal contacts.

9. The communication system of claim 1, wherein the ground beams and the signal beams include compliant pins being press-fit into the circuit board.

10. The communication system of claim 1, wherein the housing includes an upper shell and a lower shell, the lower shell including the contact channels, the lower shell including cable channels receiving corresponding cables, the upper shell being coupled to the lower shell.

11. A cable assembly comprising:
a cable module including cables, a ground shield electrically connected to the cables, and signal contacts electrically connected to the cables, each cable including a cable conductor, an insulator holding the cable conductor and a cable shield surrounding the insulator, the ground shield being electrically connected to the cable shield of each cable, the ground shield including ground beams extending to ground mating interfaces, the ground mating interfaces configured to be coupled to circuit board ground contacts on a circuit board, each signal contact having a terminating pad terminated to the corresponding cable conductor, each signal contact having a signal beam extending to a signal mating interface, the signal mating interfaces of the signal contacts configured to be coupled to circuit board signal contacts on the circuit board; and
a housing holding the cable module, the housing having a mounting end configured to be mounted to the circuit board, the housing including contact channels receiving the ground beams and the signal beams with the ground mating interfaces exposed at the mounting end of the housing for interfacing with the circuit board and with the signal mating interfaces exposed at the mounting end of the housing for interfacing with the circuit board.

12. The cable assembly of claim 11, wherein the signal mating interface of the signal beam and the ground mating interface of the ground beam define a separable interface for the cable module with the circuit board.

13. The cable assembly of claim 11, wherein the ground beam and the signal beam are deflectable spring beams being compressible against the circuit board.

14. The cable assembly of claim 11, wherein the terminating pads are welded to the cable conductors of the corresponding cables.

15. The cable assembly of claim 11, wherein the ground shield includes an upper ground shield member and a lower ground shield member, the upper ground shield member extending above each of the cables and being electrically connected to each of the cable shields, the lower ground shield member extending below each of the cables and being electrically connected to each of the cable shields, the upper ground shield member being coupled to the lower ground shield member.

16. The cable assembly of claim 11, wherein the ground shield includes a ground plate extending along each of the cables being electrically connected to each of the cable shields.

17. The cable assembly of claim 11, wherein the ground shield further comprises ground blades separate and discrete from the ground plate, the ground blades including corresponding ground beams, the ground blades being coupled to the ground plate, the ground blades being positioned between corresponding signal beams to provide electrical shielding between corresponding signal contacts.

18. The cable assembly of claim 11, wherein the ground beams and the signal beams include compliant pins being press-fit into the circuit board.

19. The cable assembly of claim 11, wherein the housing includes an upper shell and a lower shell, the lower shell including the contact channels, the lower shell including cable channels receiving corresponding cables, the upper shell being coupled to the lower shell.

20. A cable assembly comprising:
a first cable module including first cables, a first ground shield electrically connected to the first cables, and first signal contacts electrically connected to the first cables, each first cable including a first cable conductor, a first insulator holding the first cable conductor and a first cable shield surrounding the first insulator, the first ground shield being electrically connected to the first cable shield of each first cable, the first ground shield including first ground beams extending to first ground mating interfaces, the first ground mating interfaces configured to be coupled to first circuit board ground contacts on a circuit board, each first signal contact having a first terminating pad terminated to the corresponding first cable conductor, each first signal contact having a first signal beam extending to a first signal mating interface, the first signal mating interfaces of the first signal contacts configured to be coupled to first circuit board signal contacts on the circuit board, wherein the first signal beams and the first ground beams are arranged in a first row;
a second cable module including second cables, a second ground shield electrically connected to the second cables, and second signal contacts electrically connected to the second cables, each second cable including a second cable conductor, a second insulator holding the second cable conductor and a second cable shield surrounding the second insulator, the second ground shield being electrically connected to the second cable shield of each second cable, the second ground shield including second ground beams extending to second ground mating interfaces, the second ground mating interfaces configured to be coupled to second circuit board ground contacts on a circuit board, each second signal contact having a second terminating pad terminated to the corresponding second cable conductor, each second signal contact having a second signal beam extending to a second signal mating interface, the second signal mating interfaces of the second signal contacts configured to be coupled to second circuit board signal contacts on the circuit board, wherein the second signal beams and the second ground beams are arranged in a second row; and
a housing holding the first and second cable modules, the housing having a front and a rear, the housing having a mounting end configured to be mounted to the circuit board, the housing including first contact channels receiving the first ground beams and the first signal beams, the housing including second contact channels receiving the second ground beams and the second signal beams, wherein the first ground mating interfaces and the first signal mating interfaces are exposed at the mounting end in the first row for interfacing with the circuit board, and wherein the second ground mating interfaces and the second signal mating interfaces are exposed at the mounting end in the second row for interfacing with the circuit board, the second row being offset rearward from the first row.

* * * * *